US006990076B1

(12) United States Patent
McNamara et al.

(10) Patent No.: US 6,990,076 B1
(45) Date of Patent: Jan. 24, 2006

(54) SYNCHRONOUS BI-DIRECTIONAL DATA TRANSFER HAVING INCREASED BANDWIDTH AND SCAN TEST FEATURES

(76) Inventors: Timothy G. McNamara, 5 York Court, Fishkill, NY (US) 12524; Bryan J. Robbins, 30 Antoinette Ave., Poughkeepsie, NY (US) 12601; William R. Reohr, 629 Kappock St., Apt. 4D, Bronx, NY (US) 10463

( * ) Notice: Subject to any disclaimer, the term of this patent is extended or adjusted under 35 U.S.C. 154(b) by 0 days.

(21) Appl. No.: 09/313,261

(22) Filed: May 18, 1999

(51) Int. Cl.
*H04J 15/00* (2006.01)

(52) U.S. Cl. ........................................ 370/241; 714/726

(58) Field of Classification Search ................ 370/229, 370/241; 714/727, 726; 713/400; 345/504
See application file for complete search history.

(56) References Cited

U.S. PATENT DOCUMENTS 5,862,152 A * 1/1999 Handly et al. .............. 714/727
5,978,419 A * 11/1999 Cassiday et al. ............ 713/400
6,008,821 A * 12/1999 Bright et al. .............. 345/504
6,128,025 A * 10/2000 Bright et al. ............... 713/400
6,256,760 B1 * 7/2001 Carron et al. ............... 714/726
6,515,515 B1 * 2/2003 Bozso et al. .................. 326/86

OTHER PUBLICATIONS

NB9103137 "Partner SRLS Improved Shift register Diagnostics", IBM Tech, Discl. Bull. (3/91) pp. 137–141.*

* cited by examiner

*Primary Examiner*—Salvatore Cangialosi
(74) *Attorney, Agent, or Firm*—Greenblum & Bernstein, P.L.C.

(57) ABSTRACT

At least one swapper circuit is electrically connected to a bus between a plurality of entities sharing the bus. The swapper comprises a pair of series connected latches and a tristate circuits, one for each data direction, connected in parallel. The swapper acts as a revolving door, capturing data traveling from either side of the bus and shuffling the data to the other side without collision. A latch circuit is connected at either end of the bus for capturing data arriving from the other side. In addition, each of the drive entities is provided with a master/slave latched equipped with scan-in/scan-out ports, respectively, to enable testing of the circuit by allowing internal nodes of the circuit to be observed without requiring an external connection for each node accessed. In a VLSI arrangement, the scan-in/scan-out ports are connected together from a plurality of such circuits such that a variety of test patterns for various hardware configurations may be realized.

17 Claims, 22 Drawing Sheets

| | SCAN MODE | SYSTEM MODE & TEST MODE |
|---|---|---|
| C1_DE_L1_Y | | E |
| A_DE_L1_Y | E | |
| C2_DE_TR_Y | | E |
| | | |
| C1_SW_TR_YtoX | | E |
| C2_SW_L2_YtoX | | E |
| C1_SW_TR_XtoY | | E |
| C2_SW_L2_XtoY | | E |
| | | |
| C2_DE_TR_X | | E |
| A_DE_L1_X | E | |
| C1_DE_L1_X | | E |
| C2 | | E |
| C1 | | E |
| B | E | |
| A | E | |

E- ENABLED

FIG.2B

| | SCAN MODE & | TEST MODE | SYSTEM MODE |
|---|---|---|---|
| C1_DE_L1_Y | | E | E |
| A_DE_L1_Y | E | | |
| C2_DE_TR_Y | | | E |
| | | | |
| C1_SW_TR_YtoX | | | E |
| C2_SW_L2_YtoX | | X | E |
| C1_SW_TR_XtoY | | ON | E |
| C2_SW_L2_XtoY | | E | E |
| | | | |
| C2_DE_TR_X | | ON | E |
| A_DE_L1_X | E | | |
| C1_DE_L1_X | | E | E |
| C2 | | E | E |
| C1 | | E | E |
| B | E | | |
| A | E | | |

E– ENABLED

FIG.3B

| | COMBINED SCAN MODE & TEST MODE | SYSTEM MODE |
|---|---|---|
| C1_DE_L1_Y | X | E |
| A_DE_L1_Y | X | |
| C2_DE_TR_Y | OFF | E |
| | | |
| C1_SW_TR_YtoX | OFF | E |
| C2orB_SW_L2_YtoX | X | E (C2 CLOCK) |
| C1_SW_TR_XtoY | ON | E |
| C2orB_SW_L2_XtoY | E (B CLOCK) | E (C2 CLOCK) |
| | | |
| C2_DE_TR_X | ON | E |
| A_DE_L1_X | E | |
| C1_DE_L1_X | OFF | E |
| C2 | | E |
| C1 | E | E |
| B | E | |
| A | E | |

E- ENABLED

FIG.4C

| | COMBINED SCAN MODE & TEST MODE | SYSTEM MODE |
|---|---|---|
| C1_DE_L1_Y | OFF | E |
| A_DE_L1_Y | E | |
| C2_DE_TR_Y | ON | E |
| | | |
| C1_SW_TR_YtoX | ON | E |
| C2orB_SW_L2_YtoX | E (B CLOCK) | E (C2 CLOCK) |
| C1_SW_TR_XtoY | OFF | E |
| C2orB_SW_L2_XtoY | X | E (C2 CLOCK) |
| | | |
| C2_DE_TR_X | OFF | E |
| A_DE_L1_X | X | |
| C1_DE_L1_X | X | E |
| C2 | | E |
| C1 | E | E |
| B | E | |
| A | E | |

E- ENABLED

FIG.4D

SYNCHRONOUS BI-DIRECTIONAL DATA TRANSFER HAVING INCREASED BANDWIDTH AND SCAN TEST FEATURES

BACKGROUND OF THE INVENTION

1. Field of the Invention

The present invention generally relates to a synchronous circuit for bi-directional data transfer between a plurality of entities sharing a bus and, more particularly, to a synchronous circuit which further includes a scan chain to render the bidirectional data path testable for very large scale integrated (VLSI) chips.

2. Description of the Related Art

Metal wiring is typically used to connect various components or macros on a chip to exchange data signals. These signal wires consume a great deal of physical space and therefore can impose an upper limit on the density of chip integration. Further, current lithographic wiring techniques also limit attainable wiring resolution. One way to better utilize wiring resources is to share bus wires between macros. A shared bus, also called a tri-state bus, enables more than one sending entity to control the state of the bus. A drawback to the tri-state bus is that typically only one data bit can be carried over a given wire per bus cycle. Hence, only one entity can drive the bus at a time. All other entities connected to the bus must be put in a high impedance state when not their turn else conflicts would occur.

SUMMARY OF THE INVENTION

It is therefore an object of the present invention to provide a synchronous circuit inserted near the center of the bus, between driving entities, such that bidirectional data moving in opposite directions on a bus during a same clock cycle are "swapped" and do not collide.

It is yet another object of the present invention to provide a scan chain so that the synchronous circuit for bidirectional data transfer can be easily tested within VLSI applications.

According to the invention, at least one swapper circuit is electrically connected to a bus between a plurality of entities sharing the bus. The swapper comprises a pair of series connected latches and a tristate circuits, one for each data direction, connected in parallel. The swapper acts as a revolving door, capturing data traveling from either side of the bus and shuffling the data to the other side without collision. A latch circuit is connected at either end of the bus for capturing data arriving from the other side. In addition, each of the drive entities is provided with a master/slave latched equipped with scan-in/scan-out ports, respectively, to enable testing of the circuit by allowing internal nodes of the circuit to be observed without requiring an external connection for each node accessed. In a VLSI arrangement, the scan-in/scan-out ports are connected together in a plurality of such circuits/such that a variety of test patterns may be applied to thoroughly verify various hardware configurations.

BRIEF DESCRIPTION OF THE DRAWINGS

The foregoing and other objects, aspects and advantages will be better understood from the following detailed description of a preferred embodiment of the invention with reference to the drawings, in which:

FIG. 2B is a table showing the clock states for the bi-directional test;

FIG. 3B is a table showing the clock states for the uni-directional test;

FIG. 4C is a table showing the clock gating for an X to Y transfer direction;

FIG. 4D is a table showing the clock gating for an Y to X transfer direction;

DETAILED DESCRIPTION OF A PREFERRED EMBODIMENT OF THE INVENTION

Figure 1A:
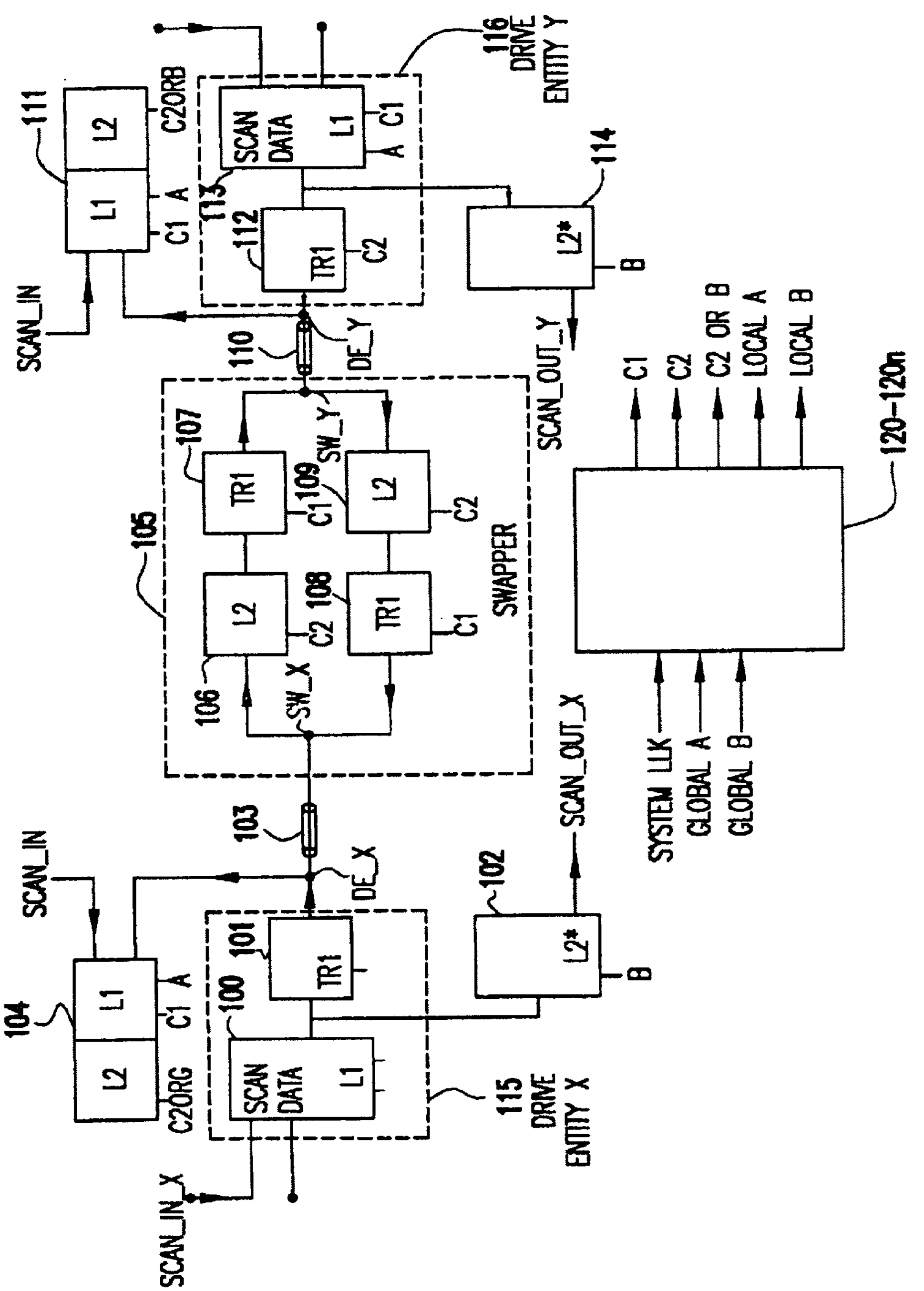
FIG. 1A is a block-diagram of the synchronous bi-directional data circuit according to the present invention.

Referring now to the drawings, and more particularly to FIG. 1A, a synchronous bi-directional data path circuit according to the present invention is shown. From left to right, the synchronous bidirectional data path circuit comprises a driving entity X 115, a first bus wire segment 103, a swapper 105, a second bus wire segment 110, and a driving entity Y 116. The Figure shows only one driving entity X or Y on either side of the bus for simplicity of illustration; however, there may be a plurality of driving entities on either side of the bus for a given application.

The driving entity X 115 comprises an L1 latch 100 having its output connected to a tristate circuit 101 for driving the bus segment 103. A slave L2* latch 102 is also connected to the output of L1 100 and acts as a slave to L1

100. The driving entity Y 116 is substantially the mirror image of the driving entity X 115 and similarly comprises an L1 latch 113 connected to a tristate circuit 112. A slave L2* latch 114 is also connected to the output of L1 113. The driving entities have a data port for accepting data to be transferred over the bus as well as a scan port for sourcing and capturing scan test patterns and test results respectively which are transferred through the slave L2* latch 102 and 104.

The swapper 105 comprises a first L2 latch 106 and tristate circuit 107 pair connected in series to carry data from left to right, and a second L2 latch 109 and tristate circuit 108 pair connected in series to carry data from right to left. Conceptually, the swapper 105 is used to replace a repeater on a long bus; however, in contrast to a repeater, the swapper 105 acts like a revolving door capturing data from both bus wire segments 103 and 110 and shuffling data to opposite bus wire segments, 110 and 103, respectively. Similar to a revolving door, each datum does not come into electrical contact with the other datum because L2 latches, 106 and 109, serving a similar role as Plexiglas partitions in a revolving door, do not allow the datum signals to mingle. Data are driven onto the bus wires 103 and 110 at the beginning of the transfer cycle. Data arrive at the swapper 105 in the middle of the cycle where each datum is swapped onto the other's bus wire segment.

Figure 1B:
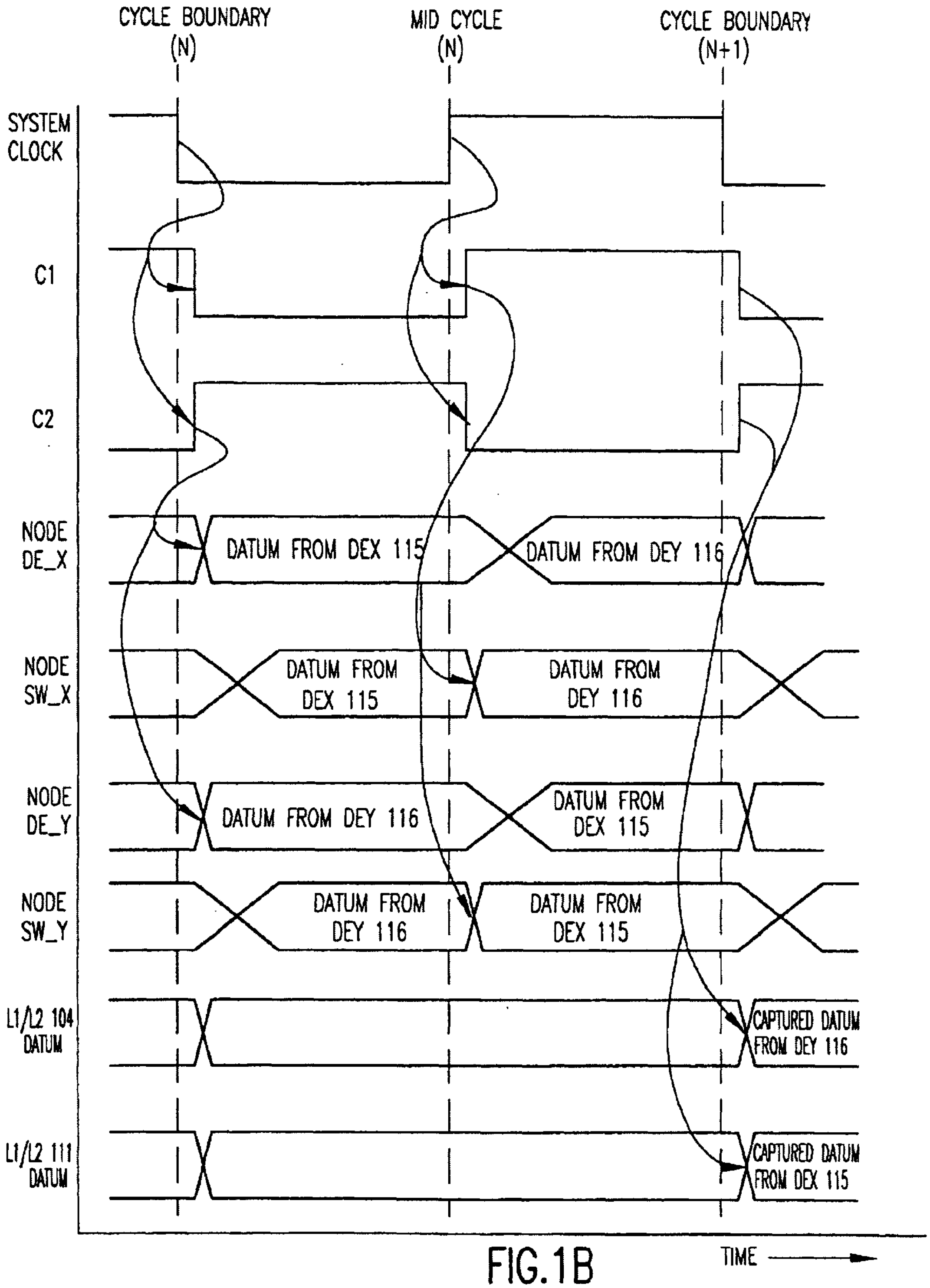
FIG. 1B is a timing diagram showing the arrival of data signals at various internal nodes of FIG. 1A.

As shown in FIG. 1B, at the end of each cycle, L1/L2 latches 104 and 111 capture the data transferred across bus wires 103 and 110. A datum launched from driving entity x 115 at the beginning of the is cycle is captured at the end of the cycle in latch 111. Likewise, a datum launched from driving entity Y 116 is captured in latch 104. Both transfers occur simultaneously within a single transfer cycle. Further circuit detail comprising clock convention has been included in FIG. 1C to describe how, during system and test modes, clocks coordinate an orderly transfer of data among the latches and tri state drivers.

Now that the bi-directional data path has been described, an overview of clocks and latches required to support its system and test modes of operation follow. Next, a CMOS implementation of driving entity and swapper circuits will be discussed, followed by a gate level description of the clock blocks. Finally, a summary section will generalize the different embodiments of the bi-directional data path and its constituent circuits.

Before preceding with a detailed discussion of system and test modes, it will be advantageous to review clock nomenclature. In level sensitive scan design (LSSD), "A" and "B" clocks are used exclusively during the test phase to shift patterns into, and retrieve test results from, the chip under test. "A" and "B" clocks are not timing sensitive and are in general either on or off. Both are almost never on simultaneously except in rare cases in which the scan chain acts as a speed sorting monitor (In that case, signals are flushed through an entire scan, comprising hundreds of latches, to quickly speed sort chips, having a wide range of delay, that come off the manufacturing line). They are used alternately (e.g. A B A B . . . ) to shift scan data through a chain of master-slave (L1/L2) latch pairs. "C" clocks, on the other hand, are system clocks. Timing of these clocks is critical to achieving fast, functional hardware. They orchestrate the flow of data within a chip during system operation.

Returning to FIG. 1A, L1 latches (for example latches 100 and 113) receive an "A" clock for scan testing and a "C1" clock for system operation. The number "1" in the "C1" clock indicates it has a specific phase relationship to the system clock, generally denoted "C" clock. Likewise, the "C2" clock which is connected to L2 latches (for example, latches 106 and 109) has a different, but unique phase relationship with the system clock. In the particular implementation shown in FIGS. 1A and 1B, "C1" and "C2" clocks work together (symbiotic relationship) to move information through what is known in the art as a "double latch" design. Finally, L2 latches sometimes get a "B" clock as exemplified by the master-slave latches 104 and 111. A "B" clock also always connects to an L2* latch (102 and 114) which is employed only during scan test modes.

FIG. 1B is a timing diagram showing the system operation of the bi-directional data path (FIG. 1A). In the preferred embodiment, C1 and C2 clocks are derived from a single system clock. In general, the synchronous behavior of the bi-directional data path could be orchestrated by N clocks (where N=0, 1, 2) which all have the same fundamental frequency, or harmonics thereof, but may have different phase relationships. Clock buffers 120–120*n* of FIG. 1A generate local C1 and C2 clocks to drive driving entity X 115, the swapper 105, and driving entity Y 116. Generally, C1 clock is in phase with the system clock and is referred to as the capture clock because its falling edge triggers the capture of data within L1 latches. A falling C1 designates the end of a cycle. C2 is out of phase with the system clock and is referred to as the launch clock because its rising edge triggers the launch of data out of L2 latches and into logic (not shown) or, in the case of the bi-directional data path, onto wire segments 103 and 110. A rising C2 designates the beginning of a cycle as depicted in FIG. 1B. Right after C2 rises, the tristate driver 101 of driving entity quickly drives node "DE_X" to a new state, either "1" or "0". The new state propagates through the wire 103 to node "SW_X". Notice the exponential characteristic of the signal as it reaches node "SW_X"; typically, an on-chip wire 103 will display RC delay characteristics. At the middle of the cycle, the swapper 105 transfers the signal originating from driving entity X 115 over to wire segment 110. Swapper latch 106 captures this new state after C2 falls. Once C1 rises, the tri state driver 107 drives node "SW_Y" quickly to the new state. The signal representing the new state propagates through wire segment 110 and reaches node "DE_Y". A falling C1 captures the new state in L1 portion of latch 111. In this way, a datum originating in region X is transferred to region Y via bus segments 103 and 110. During the same cycle, a datum flows from region Y to region X.

As known in the art, local clock blocks 120–120*n* enable local tuning, programming of phase (timing) relationships between C1 and C2 clocks. For example, short path problems may be avoided by delaying the rising edge of C2 with respect to the falling edge of C1. Note that in FIG. 1B, falling C1 and rising C2 occur almost simultaneously at the cycle boundary. Once old data (cycle n−1) is captured in latches 104 and 111 by a falling C1, new data (cycle n) held within driving entities 115 and 116 is driven onto wire segments 103 and 110 by a rising C2. Due to unavoidable skews, a short path problem may occur, whereby new data (cycle n) from 115 overwrites the old data (cycle n−1) and is captured in latch 104, if the rising C2 clock precedes the failing C1. In a real system, skews in the clock delivery arise from fluctuations in local power supplies, differences in physical implementations, etc. A similar short path problem may occur at either input or output of the swapper 105, nodes "sw_x" or "sw_y", only in contrast to the driving entities, this short path problem occurs if C1 precedes C2. All short path problems can be overcome if clocks are adjustable at a local level.

Figure 1C:
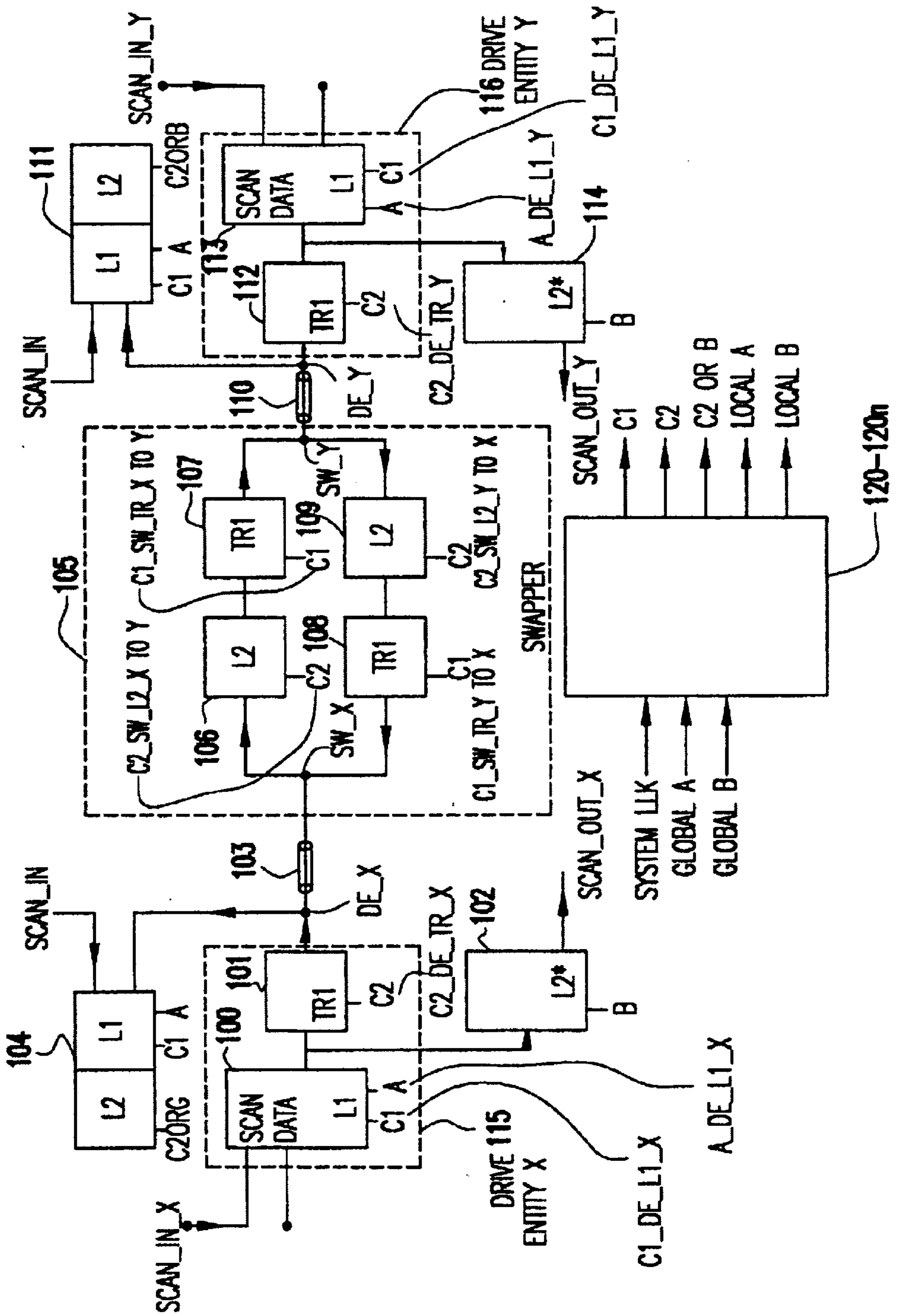
FIG. 1C a block diagram of the synchronous bi-directional data circuit of FIG. 1 showing clock nomenclature.

FIG. 1C highlights the fact that clocks labeled C2 may be further subdivided into those that drive the swapper, those that drive driving entity X, those that drive driving entity Y, and those that drive the capture latches 104 and 111. Each of these clocks may be programmed to adjust its phase relationship on a local level. Additional labeling of clocks in FIG. 1C is also necessary to describe the various methods of testing bi-directional data path.

Figure 2A:
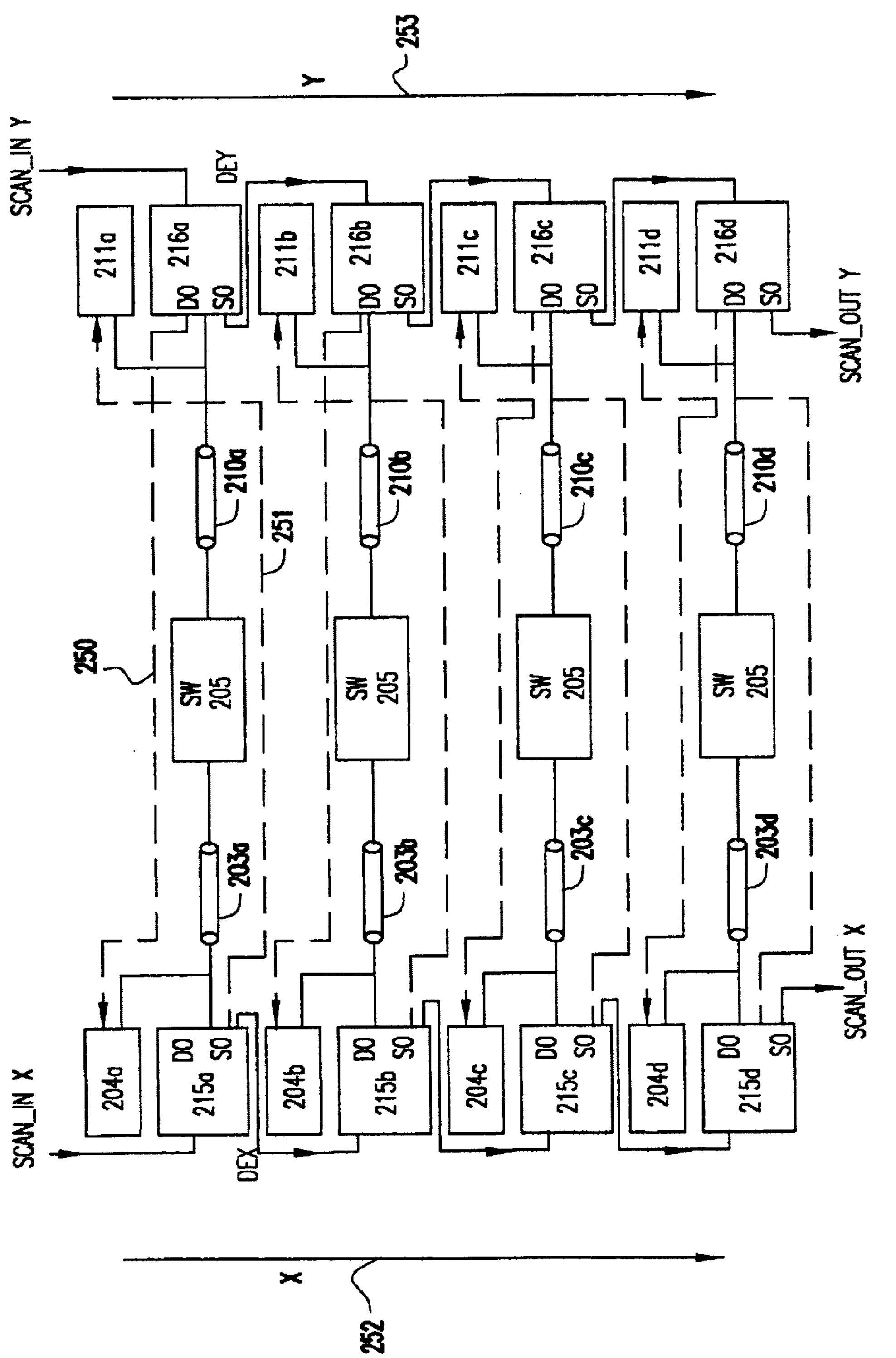
FIG. 2A is a block diagram showing the configuration for a bi-directional test.
Figure 3A:
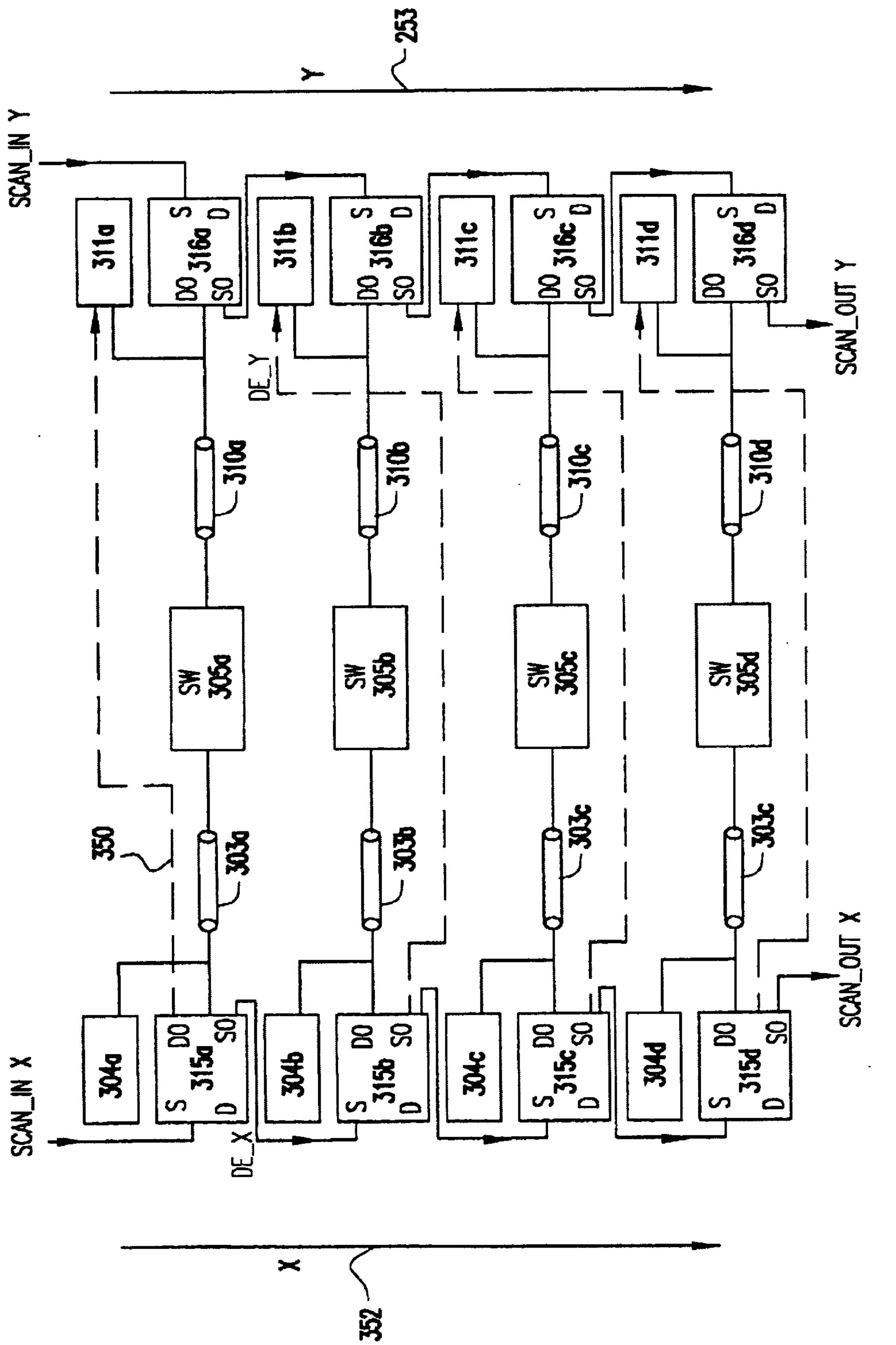
FIG. 3A is a block diagram showing the configuration for a uni-directional test.
Figure 4A:
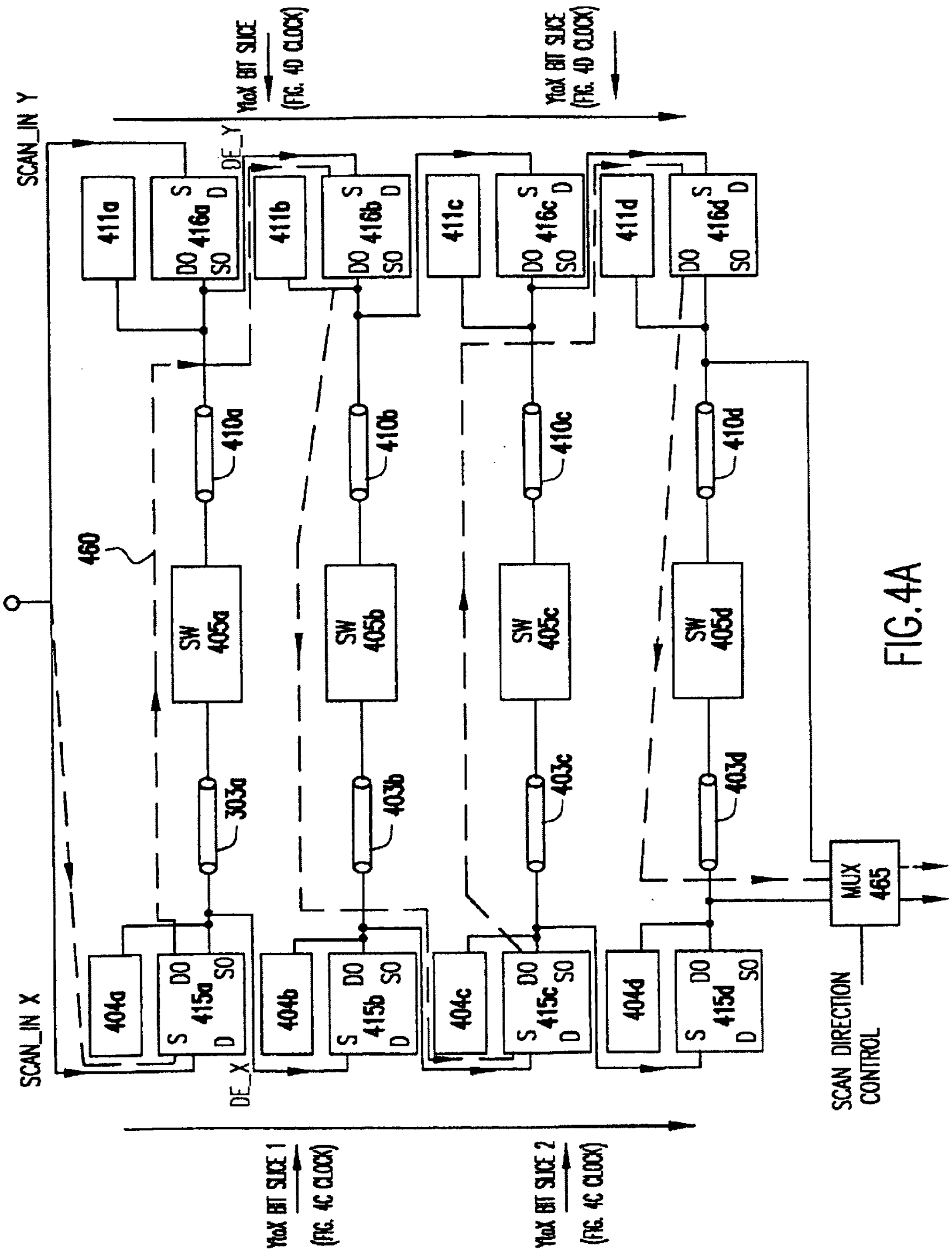
FIG. 4A is a block diagram showing the configuration for a scan functional test that the tests depicted in FIGS. 2A and 3A–B.
Figure 5:
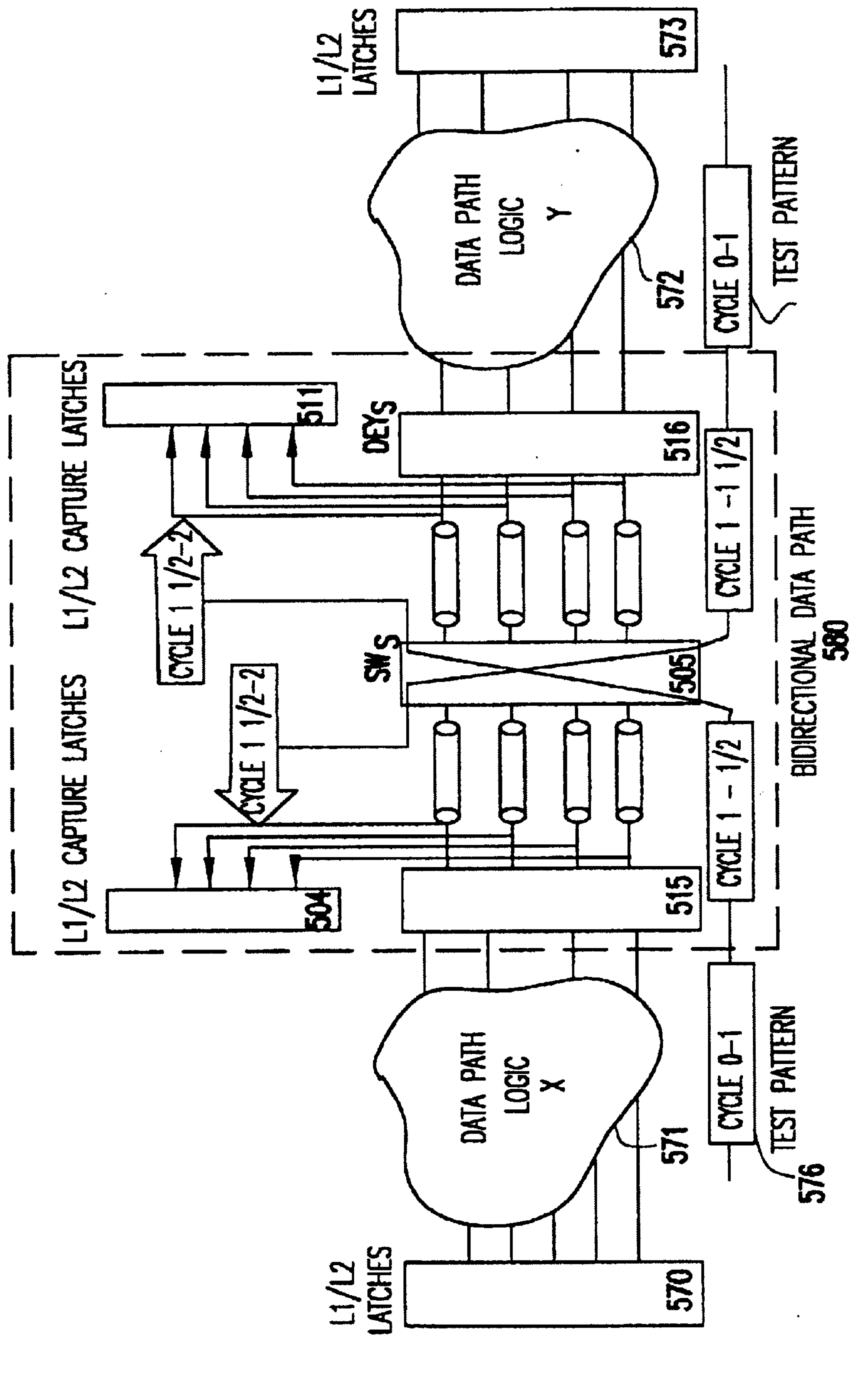
FIG. 5 is a block diagram showing the bi-directional data path circuit surrounded by generic logic and is used to describe how the bi-directional data path provides scan interfaces to enable testing of neighboring logic.

Now various embodiments for integrating a scan chain within the bi-directional data path will be described. FIGS. 2A, 3A, and 4A illustrate three different approaches to test and scan the circuitry. In all approaches, arrows attached to dashed lines (e.g. 250 and 251 of FIG. 2A) indicate the direction data move as test patterns are driven through the bus. FIG. 5 depicts the bi-directional data path surrounded by generic logic and latch strands. It is used to describe how the bi-directional data path provides scan interfaces to enable testing of neighboring logic. When the superstructure consisting of the logic combined together with the bi-directional data path is considered, two cycle tests emerge as viable candidates to test the bi-directional data path.

Referring now to FIG. 2A there is shown the test mode and test hardware which most closely resembles the system mode operation of the bi-directional data flow bus. Thick arrows 252 and 253, show how test patterns are loaded through the scan chains which are formed by connecting physically adjacent driving entities together. In this example, four X drive entities 215*a*–215*d* are connected together and four Y drive entities 216*a*–216*d* are connected together. Thick arrows 252 and 253 illustrate how test patterns and results patterns are delivered and retrieved through the scan chains. Once patterns are loaded, test patterns are applied to the bus. Tracing test path 251, driving entity X 215 drives a datum which passes through bus wire segment 203, the swapper 205, and bus wire segment 210 before being captured in latch 211. Concurrently, a driving entity Y drives a datum that follows test path 250 and is ultimately captured in latch 204. Once test results are captured, they may be removed for checking through a scan chain connecting (scan connections not shown) all capture latches together (204*a*–204*d*) and (211*a*–211*d*). The table given in FIG. 2B describes what clocks are enabled, or disabled, during system mode, test mode, and scan modes of FIG. 2A hardware. For local clocks, an "E" indicates a clock is enabled and a blank indicates a clock is disabled. The global clocking sequence for testing follows by first [1)] scanning test vectors into the driving entities, second [2)] applying test vectors to bi-directional data path, and third [3)] scanning out test results:

1) In scan mode, alternate "A" and "B" clocks stopping on "A" ("A B A B . . . A B A");

2) In test mode, issue a "C2" clock pulse followed by a "C1" clock pulse;

3) In scan mode, starting on a "B" clock, alternate "B" and "A" clocks ("B A B A . . . B A B").

Within the context of this invention, "Enabled" means a circuit will become active when its clock, either C1, C2, A, or B, is issued. "Active" means a latch is transparent and a tristate circuit drives the node attached to its output either to a "1" or "0". "On" means the circuit is active regardless of the clock states. Both "Off" and "Disabled" mean the circuit is inactive. "Inactive" means a latch is latched, and a tristate circuit is in a high impedance state.

FIG. 3A depicts a unidirectional test of the bi-directional bus and FIG. 3B is a table showing the clock states for the unidirectional test. Again test patterns are loaded through the scan chain. As depicted by thick arrow 352, only the left side driving entities (DEA) need be filled with test patterns because test patterns are only applied on the left side of the bus by DEXs and results captured on the right by latches 311*a*–311*d*. To realize this function, swappers 305 must be configured somewhat like repeaters which requires some bi-directional data path clocks to be "on", some to be enabled, and still others to be disabled. Consider for now the more detailed schematic of the swapper 105 depicted in FIG. 1C. To drive a datum from left to right exclusively and configure the swapper 105 as a repeater, L2 latch 106 and tristate circuit 107 must flush-through data, so C2_DE_TR_X and C1_SW_TR_XtoY clocks must be gated "on". The path from right to left through L2 latch 109 and tristate circuit 108 needs to be disabled by gating C2_SW_L2_YtoX and C1_SW_TR_YtoX clocks "off". A subtle problem arises with the aforementioned clock gating scheme. That is, tristate circuits 101 and 108 attached to wire segment 103 can be disabled simultaneously. This condition occurs right after test vectors are scanned in and right before test patterns are applied through the bi-directional data path. Since all drivers are disabled, the bus wire segment may float to any voltage through mechanisms such as coupling from adjacent wires or leakage within transistors. One potential problem is that a floating node settling between GND (low power supply) and VDD (high power supply) DE_X may turn on transistors within L1 latch of 104 which would reek havoc on quiescent current tests, known in the art as "IDQ" tests. To avoid this and other unpredictable situations, as depicted in FIG. 2B C2_DE_TR_X driving tri state driver 101 and C1_SW_TR_XtoY must be forced "on" during test mode to ensure wire segments 103 and 110 are driven to an known voltage, either "VDD" or "GND"; C2_SW_L2_XtoY is enabled; C1_SW_TR_YtoX and C2_DE_TR_Y is disabled; C2_SW_L2_YtoX is enabled or disabled. With the gating of local clocks, the test sequence follows the same three step procedure as that given for the bi-directional test, of course, a complete test requires the unidirectional be repeated, with one provision that the test vectors are applied by the driving entities on the Y side, and the result vectors are captured in latches (304*a*–304*d*) on the X side.

FIG. 4A depicts an approach to testing in which scanning performs a functional test of the bi-directional bus. Alternating "A" and "B" clocks move test data through the scan path 460 which zigzags through the bus. A test datum passes from scan_in input through driving entity 415*a*, bus wire segment 403*a*, swapper 405*a*, bus wire segment 410*a*, driving entity 416*b*, bus wire segment 410*b*, swapper 405*b*, bus wire segment 403*b*, and so fourth until it is driven, by scan_out MUX 465, to another scan chain.

Figure 4B:
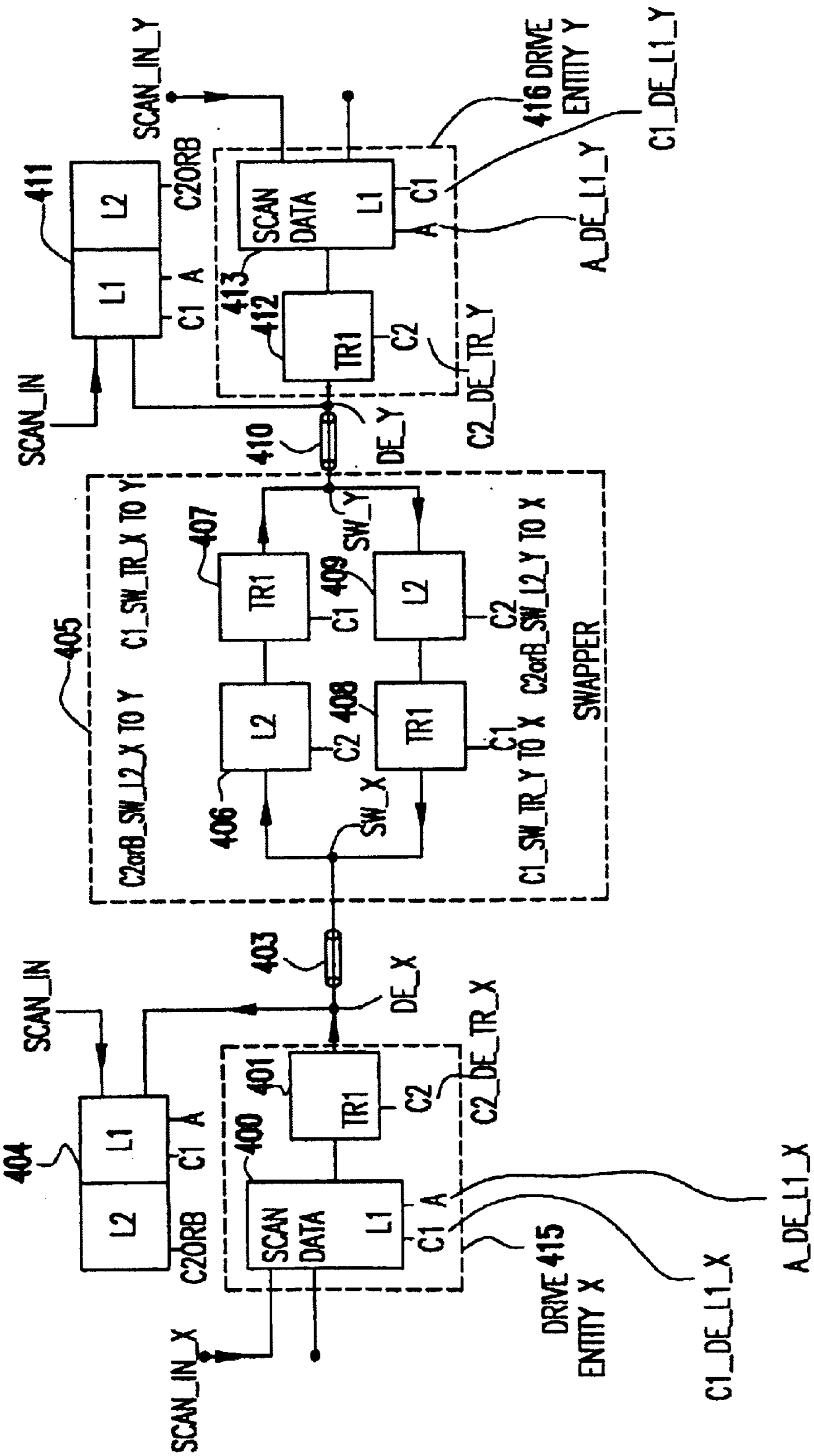
FIG. 4B a block diagram of the synchronous bi-directional data circuit as shown in FIG. 1C with the L2* latches removed.

The advantage of zigzag test mode is that it simplifies the hardware infrastructure, eliminating the need for scan only L2* latches 102 and 114 included in FIGS. 1A and 1C. FIG. 4B shows the new bit slice of the bi-directional data path which replaces FIG. 1C. The primary change, other than the removal of L2* latches, is the B clock is Ored together with the C2 to drive swapper L2 latches 406 and 409. Following previously established conventions, local clock names become C2orB_SW_L2_XtoY and C2orB_SW_L2_YtoX. To support a zigzag test, clocks are gated in a similar manner as they would be for a unidirectional test depicted in 3A. The added provision is that the direction of the data flow alternates each bit slice as noted in FIG. 4A: XtoY Bit Slice 1, YtoX Bit Slice 2, XtoY Bit Slice 3, YtoX Bit Slice 4, etc. The gating of clocks noted in FIG. 4C for XtoY transfer direction (FIG. 4D for YtoX transfer direction) is very similar to that of 3B only the B clock, instead of the C2 clock, drives data through the swapper L2 latch 406 (or 409). The zigzag test, as thus far described, completely ignores the functional verification of driving entities 416*a* and 415*b* & 416*c* & 415*d*, and only validates unidirectional data transfer capability of swappers 405*a*–405*d*. To fully test all entities depicted in FIG. 4A, the zigzag test must be repeated only this time with the direction of data flow reversed within each bit slice. Complete zigzag testing is a two step process that requires both "Z" style testing, as depicted by FIG. 4A, and "S" style testing, not depicted in any figure, but just described in the previous sentence:

"Z" SCAN Test (Depicted in FIG. 4A, Data Flow Depicted by Dotted Line 460)

1) Gate clocks so data follows a "Z" path through bi-directional data path.
2) Scan data through driving entities, wire segments, and swappers by alternating A and B clocks (ABA . . . B).

"S" SCAN Test (Data Moves in the Opposite Direction as the "Z" SCAN Test)

1) Gate clocks so data follows a "S" path through hi-directional data path.
2) Scan data through driving entities, wire segments, and swappers by alternating A and B clocks (ABA . . . B).

FIG. 5 shows the bi-directional data path 580 surrounded by other "X" and "Y" data path logic. The schematic is useful for two reasons. First, it illustrates how the driving entities of the bi-directional data path act as capture latches during a one cycle test of the surrounding logic. Second, it provides the necessary superstructure required to perform a two cycle test of the bi-directional data path.

A standard latch to latch test, known in the art, may be performed on the data path logic of FIG. 5. Test vectors are loaded via L1/L2 latches 570 (or 573). Test pattern flows through data path logic 571 (or 572) in the direction of arrow 574 (or 575). Results are captured and the scanned out through driving entities 515 (or 516) of the bi-directional data path 580. Each scan test requires its own independent application of a test vector and capture of a resultant vector, separated in time from the other scan operation. The only exception to this case occurs in zigzag testing depicted in FIG. 4A. Test vectors must be applied twice and shifted out twice to capture the complete resultant test vector. Both "S" and "Z" zigzag scan_outs must be performed for each new test vector to shift out all bits of the resultant vector. A "Z" ("S") scan only shifts out every other driver entity bit within the bi-directional data path.

As shown in FIG. 5, a two cycle test applied to the data path logic 571 and 572 and the bi-directional data path 580. Arrow 576 (577) indicates the flow of test data from L1/L2 latches 570 (573) through data path logic 571 (572) through driving entity Xs 515 (516) through a bus wire segment through swapper 505 through another bus wire segment, finally, to L1/L2 capture latches 511 (504). A running cycle tally is also included within arrows 576 and 577. A two cycle test is possible because the data flow circuits have no feedback. Also, the bi-directional data path does not transform the data passing through it. It only acts as a channel to move data from one region of the chip to another. For a single cycle latch to latch test, the resultant vector is captured in driving entities 515 (516), For the two cycle test, the data move one more step unaltered to the next set of latches, the L1/L2 capture latches 511 (504). No new test vectors need be generated. The test vectors for the one and two cycles are the same, the resultant vectors just wind up being captured by different latches. The three step process for the two cycle test follows:

1)In scan mode, scan in test vector with alternating A and B clocks stopping on A (A B . . . A)
2) In system mode, issue C2 clock, then C1 clock, then C2 clock, and finally C1 clock.
3)In scan mode,scan out resultant vector starting on a B clock (B A . . . B)

Figure 6:
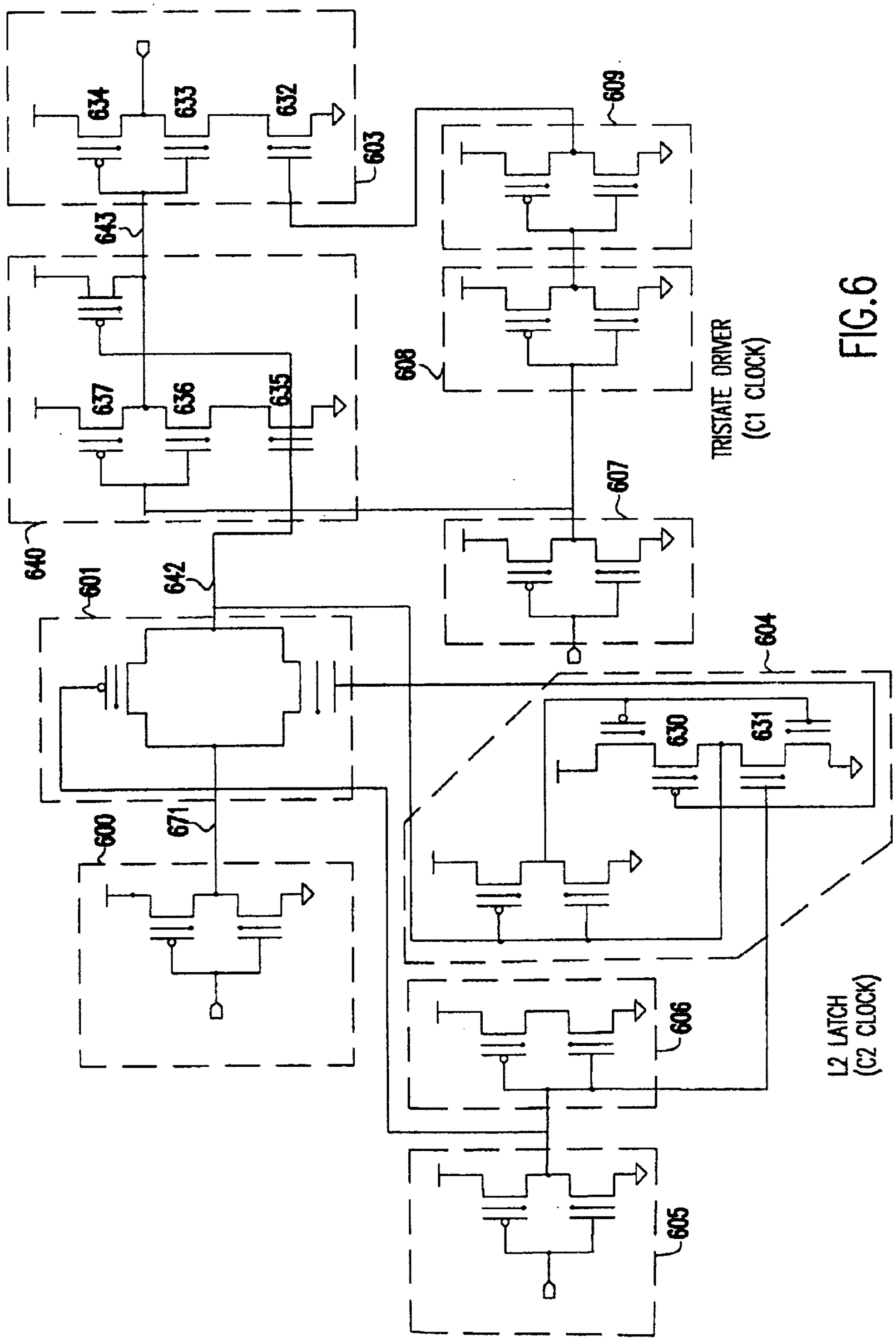
FIG. 6 is a circuit diagram showing a half-swapper.
Figure 7:
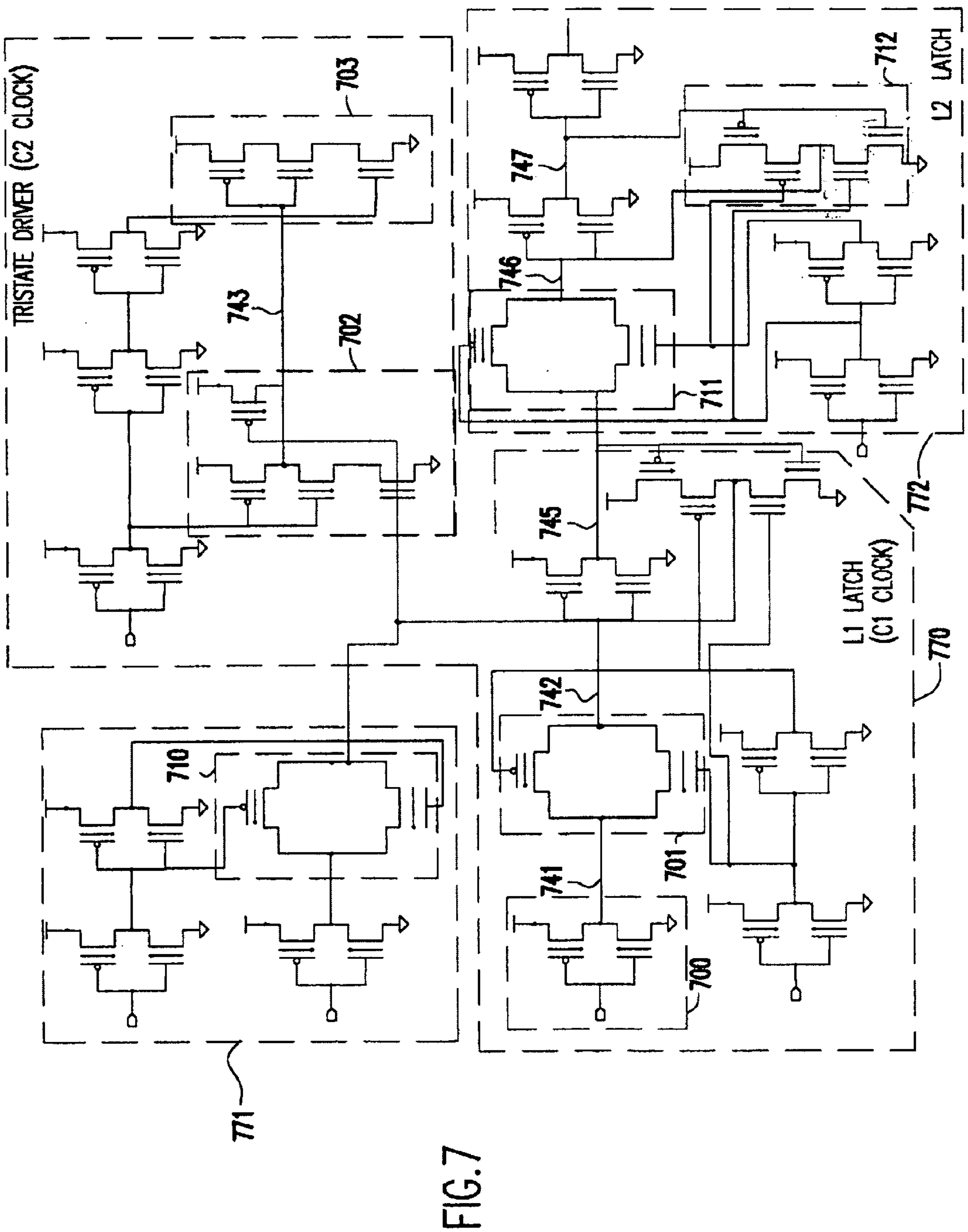
FIG. 7 is a circuit diagram showing a driving entity.

After the preceding elaboration on functional and test issues of the bi-directional data path, following is a practical CMOS implementations of the subcircuits. A bi-directional data path comprises two (or more) half swappers, as shown in FIG. 6, and two (or more) driving entities, as shown in FIG. 7. A full swapper (e.g. swapper 105 of FIG. 1A) is formed by connecting the input of one half swapper with the output of another and vice versa. A half swapper comprises an L2 latch, for example 106 of FIG. 1A, and a tristate driver, for example 107 of FIG. 1A. The data path through the half swapper of FIG. 6 traverses, from "in_swap" to "out_swap", an input logic stage 600, herein shown as an inverter, a pass gate 601, a NAND gate 602, and an inverter with a ground interrupt 603. The half swapper is inverting and so is the driving entity (FIG. 7). However, a series combination of the driving entity and the swapper forms a non inverting data path.

The L2 latch portion of the half swapper comprises sub circuits 600, 601, 604, 605, and 606. Input logic stage 600 performs a logic function such as inversion or muxing, improves the slew rate of a slowly falling or rising signal at "in_swap", and suppresses any noise (especially coupled noise above VDD and below GND) into pass gate 601. The local C2 clock governs the transfer of data through the next stage of logic, the pass gate 601. Local inverters 605 and 606 provide inverted and non inverted phases of the C2 clock to the pass gate 601. When the C2 clock is inactive and the pass gate 601 is off, static latch 604 maintains the logic state of the datum stored on node 642. The pass gate 601 is transparent when the C2 clock is active. Both phases of the C2 clock drive the gates of tristate transistors 630 and 631 of the feedback inverter so the feedback is disabled as new datum is driven into the tristate driver portion of the half swapper.

The tristate driver portion of the half swapper comprises sub circuits 602, 603, 607, 608, and 609. Inverters 607, 608, and 609 provide inverted and non inverted phases of the C1 clock to the tristate circuit comprising NAND 602 and inverter with a ground interrupt 603. Depending upon the phase of the C1 clock, the tristate circuit is put either into a transparent state or a high impedance state. High impedance is attained on the inverter with the ground interrupt 603 by driving node 640 low which forces node 643 high through PFET 637 ,and almost concurrently, except for the delays of inverters 608 and 609, shuts off interrupt transistor 632. The net result of these actions is the path from "out_swap" to ground is disabled by interrupt transistor 632 and the path from "out_swap" to VDD is disabled by PFET 634 since the gate of PFET 634 has already been set high to VDD. Thus, high impedance on the output section 603 of the half swapper is achieved. To activate the tristate circuit, node 640 must be driven high. In this case, nand 602 becomes an inverter because PFET 637 is disabled and transistor 636 is turned on thus shunting the drain of NFET 635 to node 643. Similarly, the inverter with a ground interrupt 603 becomes an inverter because transistor 632 is turned on thus shunting ground to the source of NFET 633. The tristate circuit in a transparent mode acts like two back to back inverters driving the state stored on node 642 to the output, "out_swap".

The inverting system data path through the driving entity of FIG. 7 traverses, from "in_de" to "out_de", an input logic stage 700, herein shown as an inverter, a pass gate 701, a NAND gate 702, and an inverter with a ground interrupt 703. The circuit topology of sub circuit 770 is identical to that of the half swapper of FIG. 6. The subtle difference between the operation of the two circuits is the driving entity latch receives a C1 clock and its tri state driver a C2 clock whereas the half swapper latch receives a C2 clock and its tri state driver a C1 clock. Distinct system clocks cause the data to be transferred through tristate and latching circuits at different times during the cycle (as shown in FIG. 1B). In addition to the half swapper circuits, the driving entity also has an "A" port 771 and an L2* slave latch 772, both used for scan testing. (Note that the L2* latch is not needed to support the scan test mode described with reference to FIGS. 4A through 4D.) The "A" clock loads a test datum from the "scan_in input through to node 742. The "A" clock enables test data to be loaded and, with the addition of a "C2" clock, to proceeded from node 742 through system path node 743, out through output "out_de", and so on through other sub circuits and wire segments of the bi-directional data path as was described earlier in the text with reference to FIGS. 2A–2C, 3A–3C, and 4A–4D. The alternative to the system path is the scan path. Again an "A" clock loads a datum from the "scan_in" input through pass gate 710 to node 742, only this time, the datum continues through an inverter to node 745, and with the addition of a "B" clock , moves on through pass gate 711 through two inverters to output "scan_out". Referring to FIG. 5, resultant test vectors may be captured in the driving entity of FIG. 6 and scanned out. A resultant datum from test pattern 574 of FIG. 5 may be scanned out from driving entity of FIG. 7 via the sequence of an "C1" clock followed by a "B" clock and thereafter through other driving entities and scan latches with alternating "A" and "B" clocks.

Figure 8:
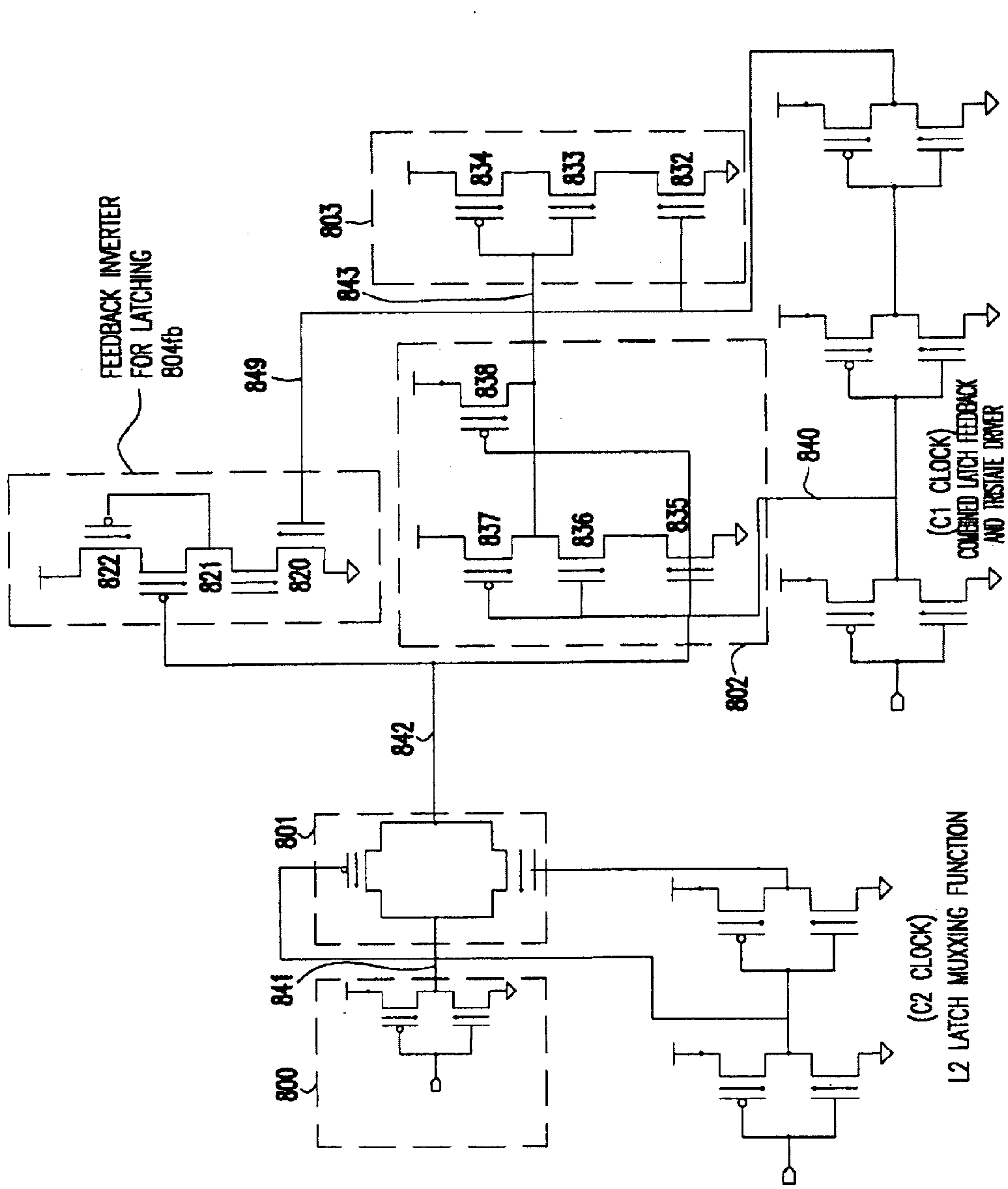
FIG. 8 is a circuit diagram showing a second embodiment of the half swapper circuit.

FIG. 8 illustrates a second embodiment to the half swapper depicted of FIG. 6. The implementation of FIG. 8 requires fewer transistors and wire connections than that of FIG. 6. Like the earlier embodiment of FIG. 6, the data path through the half swapper of FIG. 8 traverses, from "in_swap" to "out_swap", an input logic stage 800, herein shown as an inverter, a pass gate 801, a NAND gate 802, and an inverter with a ground interrupt 803. In fact, the subcircuits of FIG. 8 are the same as sub-circuits 600, 601, 602, and 603 of FIG. 6, respectively. The unique feature of half swapper depicted in FIG. 8 is that it contains a feedback inverter for latching 804 as opposed to the separate static latch 604, used in FIG. 6. The static latch function is provided in part by the feedback inverter for latching 804 but requires some amount of integration with NAND 802 via node 843 and a connection to a derivative of the tristate signal via node 840 node 849, to achieve the function provided by static latch 604 (FIG. 6). NAND 802 works together with the feedback inverter for latching 804 to form a static latch. Enabling the tristate signal (tris_clkn="0") causes nodes 840 and 849 to both be high. Circuits 802 and 804 become back to back inverters that together form a static latch:

In the case of circuit 804, an active NFET 820 shunts the source of NFET 821 to ground. Together PFET 822 and NFET 821 comprise an inverter. In the case of circuit 802, PFET 837 is disabled, and an active NFET 836 shunts the drain of NFET 835 to node 843; together NFET 835 and PFET 838 constitute an inverter. On the other hand, disabling the tri state signal (tris_clkn="1") grounds nodes 840 and 849 which in turn sets circuit 804 into a high impedance state. Since node 843 is driven to VDD by an active PFET 837, the PFET 822 is disabled. No path to VDD is provide by circuit 804 in this state. Furthermore, NFET is disabled since its gate, which is connected to node 849, is grounded. Circuit 804 provides no path to ground. It follows then that circuit 804 is in a high impedance state.

In summary, NAND 802 performs a dual role in the half swapper circuit of FIG. 8. It partially disables both feedback inverter for latching 804 and the inverter with a ground interrupt 803, assisting in the establishment of a high impedance state for both circuits. Therefore, the function of the latch signal (latch_clkn) and the tristate signal (tris_clkn) are mingled in this embodiment of the half swapper. Latch signal shuts off pass gate 801 to trap charge, and thus state, temporarily on node 842. However to maintain the state stored on node 842 and thus latch signal, positive feedback must be enabled by asserting the tristate signal. Under system and test modes, clocks must be gated orthogonally (complementary) to satisfy this peculiar relationship.

Figure 9:
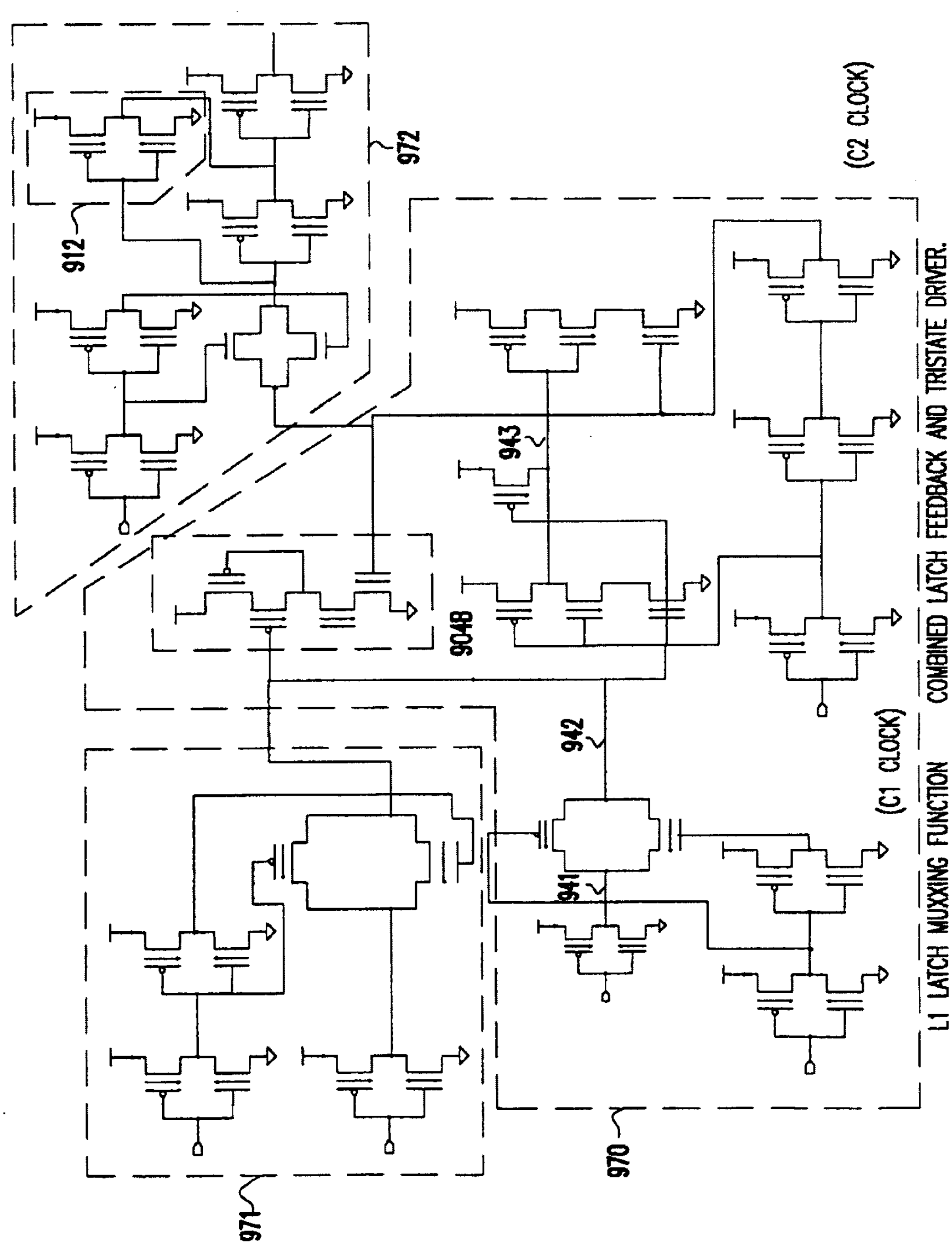
FIG. 9 is a circuit diagram showing a second embodiment of a driving entity.

FIG. 9 depicts a second embodiment of the driving entity which incorporates the circuit simplifications of FIG. 8. In fact, the circuit topology of sub circuit 970 is identical to that of the half swapper of FIG. 8. The subtle difference in the operation of the two circuits is the driving entity latch receives a C1 clock and its tri state driver a C2 clock whereas the half swapper latch receives a C2 clock and its tri state driver a C1 clock. Distinct system clocks cause the data to be transferred through tristate and latching circuits at different times during the cycle (as depicted in FIG. 1B). Similar to FIG. 7, the driving entity has an "A" port 971 and an optional L2* slave latch 972, both used for scan testing. In FIG. 9, the L2* slave latch is depicted with active feedback 912 rather than the interruptable feedback 712 of FIG. 7.

Figure 10:
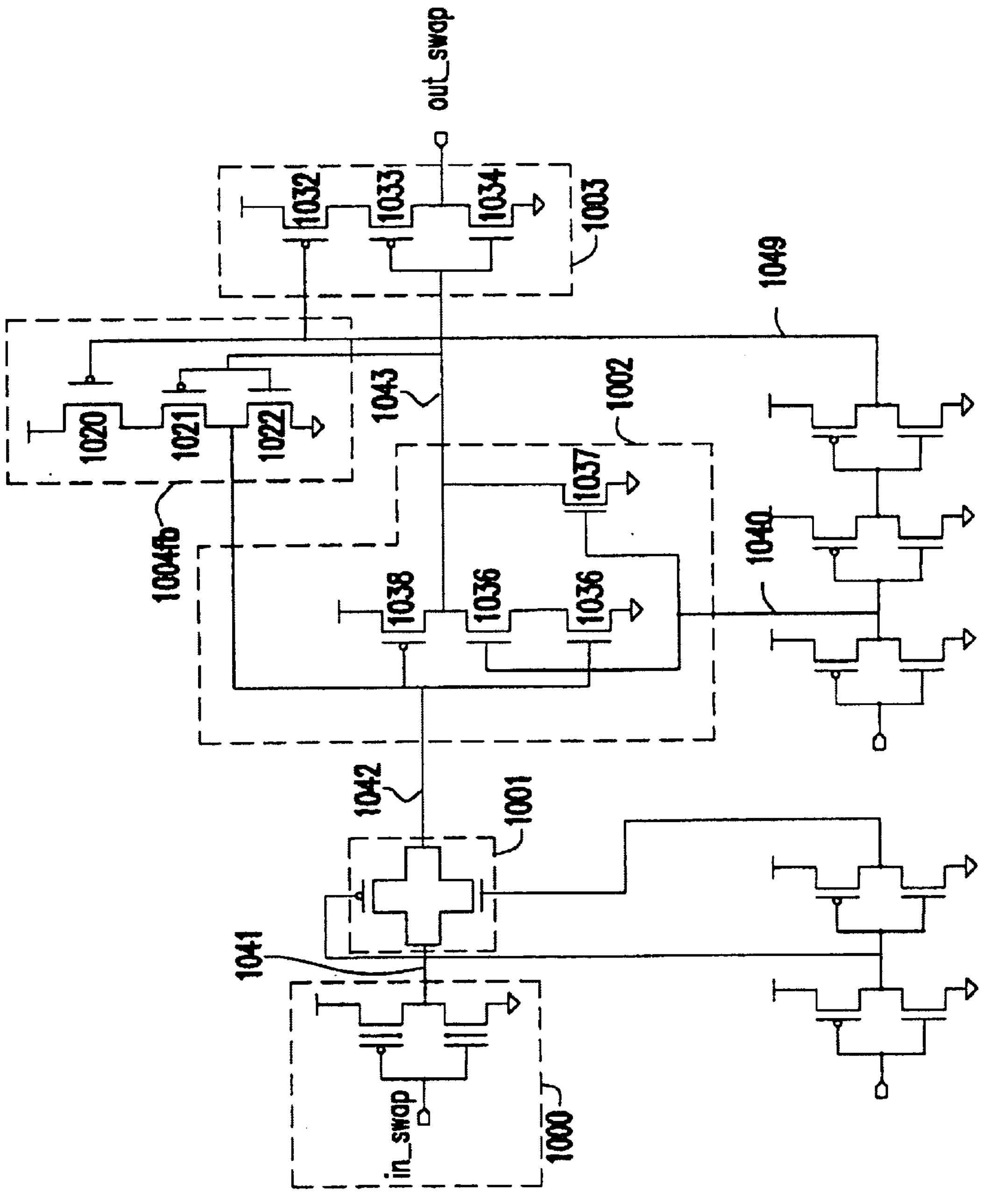
FIG. 10 is a circuit diagram showing a third embodiment for the half swapper having PFET gating transistors.

FIG. 10 is a circuit diagram showing a third embodiment of the half swapper circuit shown in FIG. 8. The input logic stage 1000 and the pass gate 1001 are identical to those (800 and 801) of FIG. 8. Other subcircuits have PFET and NFET gating transistors interchanged. These include inverter with a ground interrupt 1003 (803) and feedback inverter for latching 1004 (804). Additionally, sub-circuit NAND 802 becomes NOR 1002. Minor circuit topology permutations, like the of FIG. 10, do little to alter the primary function of the half swapper circuit other than to invert tristate clock signals and the tristate control node 1043. Via the tristate signal (tris_clkn), a high signal driven onto nodes 1040 and 1049 (instead of a low signal for nodes 840 and 849 of FIG. 8) forces the output inverter with ground interrupt 1003 into a high impedance state and disables the feedback inverter for latching 1004. Node 1043 is shunted to ground by transistor 1037 which disables NFETs 1022 and 1034. In this state, no path to ground exist for either "out_swap" or node 1042. For these same nodes, PFETs 1020 and 1032 cut off the path to the high power supply VDD. In contrast, a low signal driven onto nodes 1040 and 1049 causes the signal stored on node 1042 to be both statically latched through the positive feedback provided by the feedback inverter for latching 1004 and also driven out through the "out_swap" output. With only a change of phase in the tristate signal path, FIG. 10 achieves the same function as circuit shown in FIG. 8.

Figure 11:
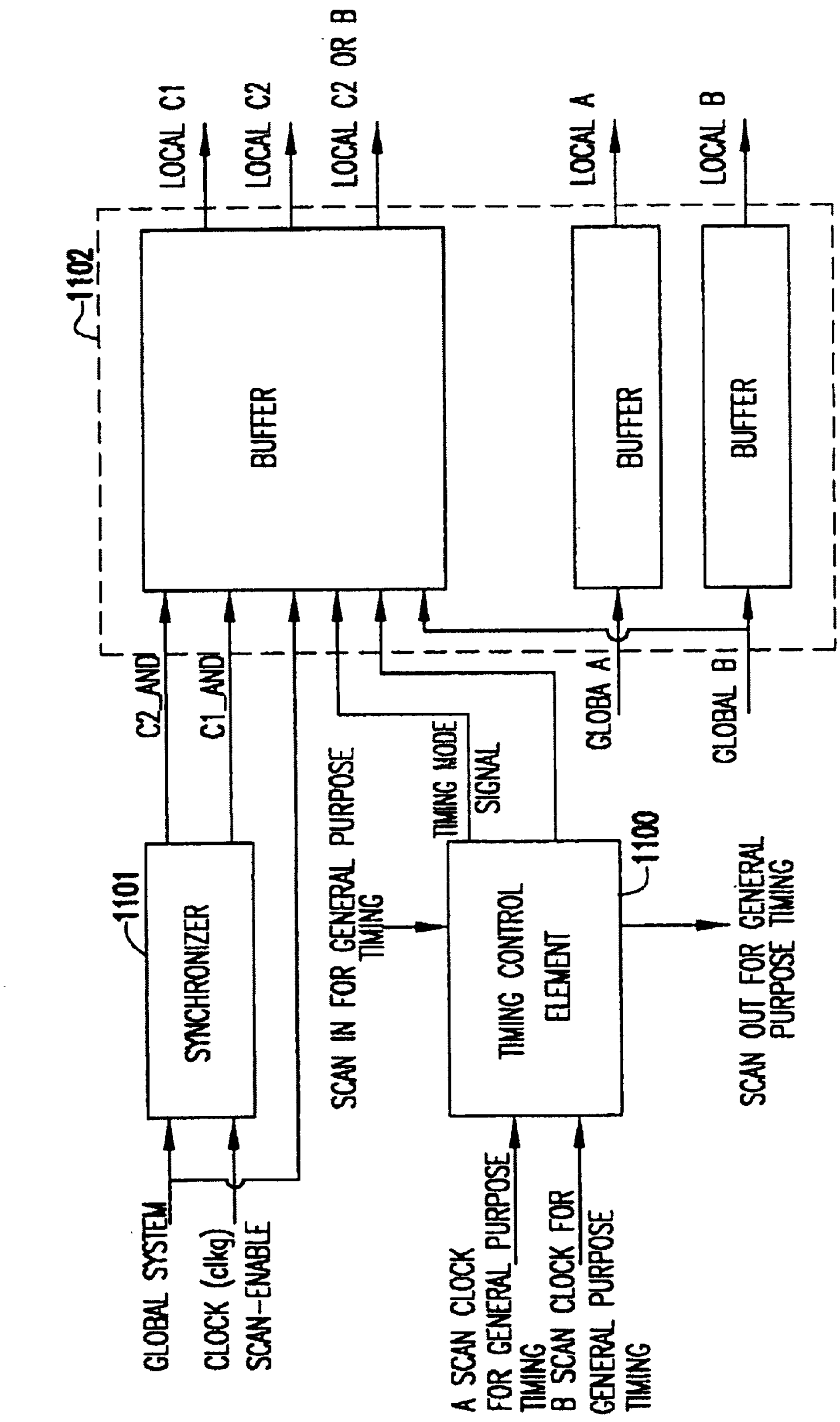
FIG. 11 is a block diagram of local clock blocks which gate and then redrive scan and system clocks into the driving entities and swappers.

FIG. 11 shows, local clock blocks which gate and then redrive scan and system clocks into the driving entities and swappers. Swappers and driving entities have individually customized local clock blocks. In general however, the local clock blocks have common sub-circuit functions which, as shown in FIG. 11, include a timing control element 1100, a synchronizer 1101, and local clock drivers 1102. The timing control element 1100 stores timing adjustment signals in either latches or maintains them permanently with the assistance of fuses. The "A SCAN clock for general purpose timing" and "B SCAN clock for general purpose timing" are used to shift timing adjustment data into the timing control element 1100 just as "A" and "B" scan clocks shift test vectors into system latches. The difference between both SCAN chains is the contents of timing control latches are never altered during system operation. Timing adjustments are set before testing or system operation begins and remain in effect during the entire period of system operation, thus guaranteeing consistency between critical timings like data launch and data capture. Timings may only be adjusted once the system clocks are gated off within the local clock driver 1102. Timing mode signals feed the local clock drivers where they adjust timing critical edges of the "C1" and "C2" clocks, both of which are derived from the global system clock.

The synchronizer 1101 aligns the phase of "scan_enable" with that of the global system clock to eradicate the potential for glitches when two disjoint timing signals are merged together. "Scan_enable" drives the local clock blocks into either scan (scan_enable=1) or system (scan enable=0) mode operation. In this particular embodiment, the synchronizer produces "C2_and" and "C1_and" signals which are high active gating signals. A low "C2_and" and low "C1_and" sets the local clock drivers 1102 into system mode operation. "C2_and" and "C1_and" signals have different phase relations, usually about 180 degrees out of phase (depending upon the relationship between cycle boundary and mid cycle clock edges). Depending on the state of the scan_enable signal, each gating signal may persist for an integer multiple of the cycle time where signal duration equals N times the cycle time (N=1, 2, 3, . . . ).

Figure 12:
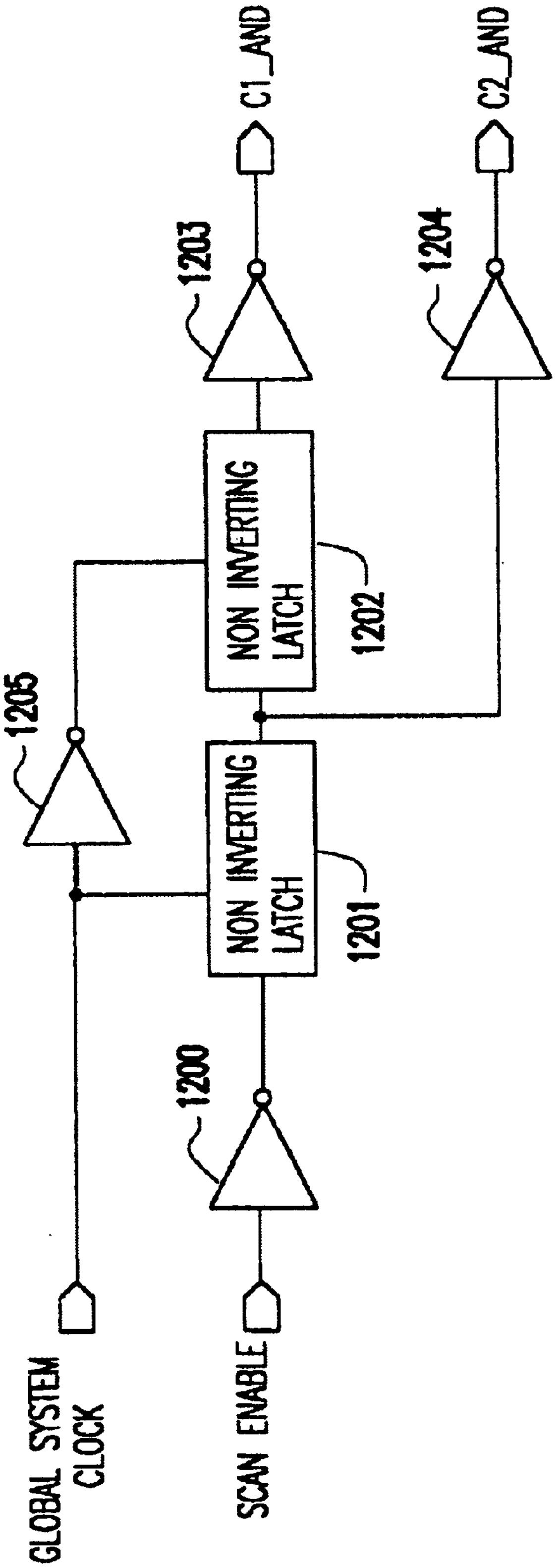
FIG. 12 is a circuit diagram of a synchronizer.

FIG. 12 shows a schematic implementation of the synchronizer. Inverter 1200 is included in the synchronizer schematic to ensure the "scan_enable" signal has enough local signal strength to overwrite latch 1201 (for example a pass gate latch) during the time that it should be transparent. Inverters 1203 and 1204 provide improved drive to, and the correct phase for, the "C1_and" and "C2_and" signals. Latches 1201 and 1202 are clocked by in-phase and out-of-phase versions of the global clock respectively. Each latch is associated with, and accounts for, a C2 or C1 pulse developed within the local clock driver 1102 of FIG. 11. Observe that a high "scan_enable" causes both "C1_and" and "C2_and" to go high eventually. A high "scan_enable" gates the local C1 and C2 clocks off so that they do not collide with "A" and "B" clocks during scan mode. In this particular design where the global system clock is left free running, the state of the "scan_enable" signal defines the mode of operation. The combination of clocks and latches default to scan mode operation when "scan_enable" is high and to system mode operation when the "scan_enable" signal is low. Asserting the scan clocks ("A" and "B" clocks) only in conjunction with the "scan_enable" assures orthoganality is maintained between the system clock (or "C" clock) and scan clocks ("A" & "B" clocks).

Local clock signals, like those in FIGS. 2B, 3B, 4C, and 4D, are developed within the local clock drivers. It is within them that global "A", "B" and "C" (system) clocks may be modified to suit the needs of the bi-directional data path. For example, clock gating may be used to disable system clocks so they don't reach latches or tristate drivers during scan mode operation. Clock ORing may be used to produce combinations of global clocks such as "C2orB" signals specified in FIGS. 4B, 4C and 4D. Furthermore in the case of the system clocks, timing adjustments may be made on the local level to enable cycle stealing (used to improve machine cycle time), clock stressing (done to screen out potential short path problems during manufacturing test), and timing relief (used to fix unanticipated short path problems arising from unknown quantities such as clock skew).

Figure 13:
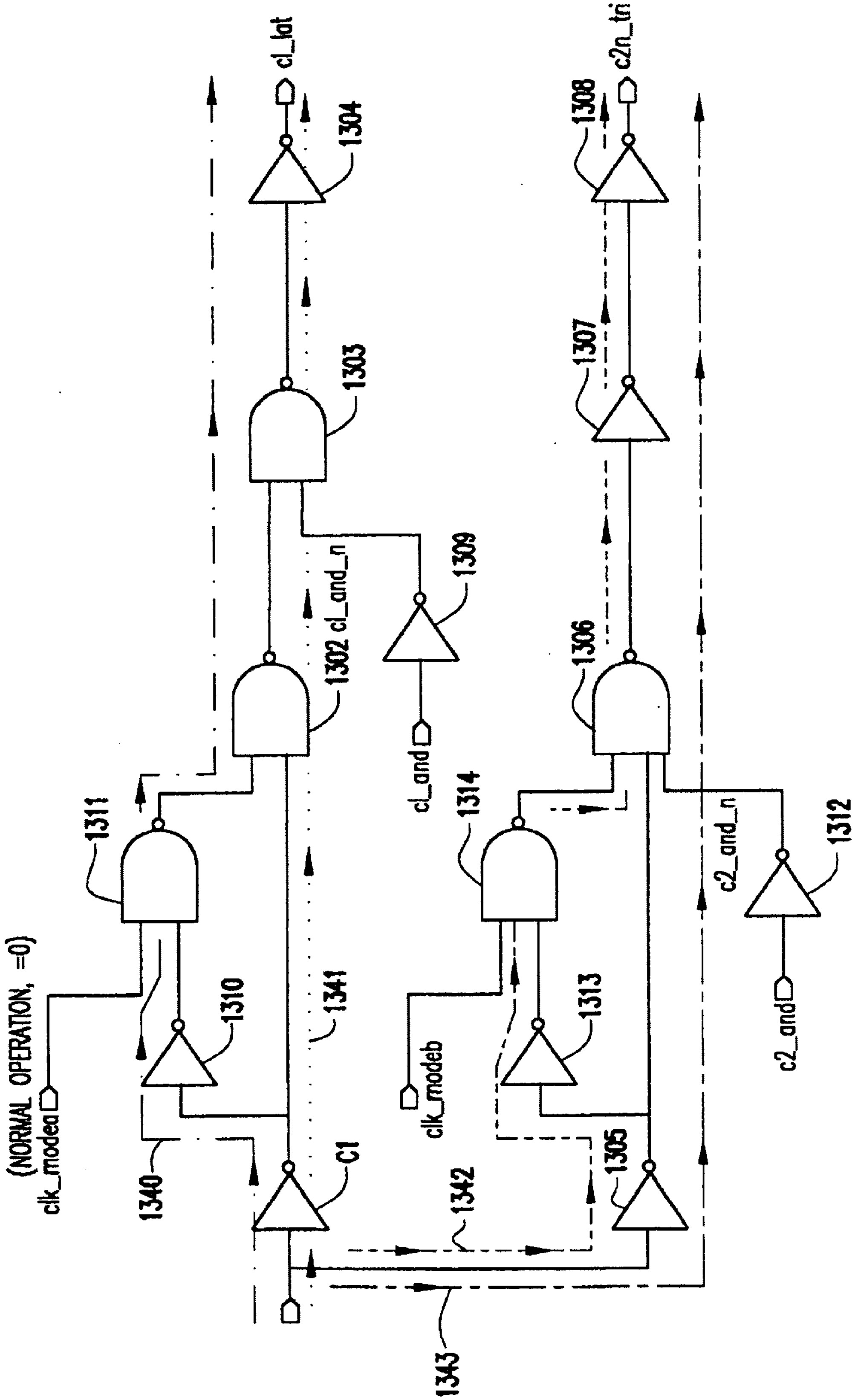
FIG. 13 is a circuit diagram of a local clock driver for the driving entities.

FIG. 13 is a schematic diagram of the local clock driver for the driving entities. In system mode, the global system clock propagates through four inverting stages 1301, 1302, 1303, and 1304 to produce a non-inverting pulse on output C1_lat and likewise, through four inverting stages 1305, 1306, 1307, 1308 to produce a non-inverting pulse on output C2n_tri. In this particular embodiment, a falling global clock edge denotes the beginning of a new cycle. A low transition on output C1_lat sets the driving entities' L1 latches into a hold state. A low transition on output C2n_tri sets the driving entities' L2 tristate driver into a high transparent state. Thus a falling global clock edge triggers the latching of data within the L1 latch and launch of data out of the L2 tristate driver in much the same way as it would in a master-slave (L1/L2 pair) cycle boundary latch. Inverting stages within the clock drivers may be used for three distinct purposes: first for gain, second for clock gating, and third for signal steering/routing (timing adjustments).

In scan mode, clock gating of C1_lat is accomplished by inverter 1309 combined with NAND 1303. Whenever "C1_and" is high, the "C1_lat" output is forced low which disables the system port of the L1 latches. The free running global system clock never penetrates through the local clock driver. On the other hand, the scan port of the L1 latch is still enabled. "A" and "B" clocks can shift data through the scan registers without ever incurring a collision with the global system clock. Data integrity is preserved. The clock orthogonality implicit in this LSSD scheme guarantees robust testing.

Still with reference to FIG. 13, signal steering within the local clock driver for the driving entities permits timing adjusts to be made on the local "C1" and "C2" clock edges. Dashed lines 1340 and 1341 trace alternative paths through the clock driver from input "clkg" to output "c1_lat". Paths only trace the progress of a falling "clkg" through the circuit since it governs when the L1 latch of the driving entity captures a datum and when the tristate driver of the driving entity launches that very same datum. Timing mode signal, "clk_modea", determines which path, either 1340 or 1341, is selected at a given time. Delays of various paths can be arranged to support sundry timing modes like stress, cycle stealing, or relief modes. When "clk_modea" is set low, the signal initiated by a falling "clkg" follows path 1341. A controlling low input into NAND 31311 causes it to drive a non-controlling high input into the "a" input of NAND 1302 making it appear as an inverter to signals traveling along path 1341. Path 1341 traverses fewer logic stages than path 1340, and thus path 1341 has a lower latency than 1340. Under normal operation, it is advisable to minimize the circuit delay along the clock path so that the overall skew of the clock circuit is also minimized. For diagnostic and manufacturing testing modes, margin tests have been developed to ensure adequate timing margins exist for all clock circuits under all operating conditions. Path 1340 is used for the margin tests; it serves to stress the short path timing of the logic and latches feeding the driving entity (See FIG. 5, components 570, 571, 573, and 572) by delaying the capture edge of the L1 latch.

Likewise during normal operation, a low "clk_modeb" minimizes the time it takes to launch datum out through the tri state driver of the driving entity. A falling "clkg" event proceeds along path 1343 through inverter 1305, NAND 1306, inverter 1307, and inverter 1308 to output "c2n_tri". It eventually triggers the tristate driver 101 of FIG. 1C to drive data onto buss wire segment 103. When "clk_modeb" is high, a falling "clkg" event traverses an alternative route through the clock driver. Path 1342 delays the launch of data onto bus segment 110 to provide timing relief just in case a short path problem crops up in a master-slave capture latch 111. Obviously, clock driver designs can be adapted to handle clock stress modes and short path recovery modes.

Figure 14:
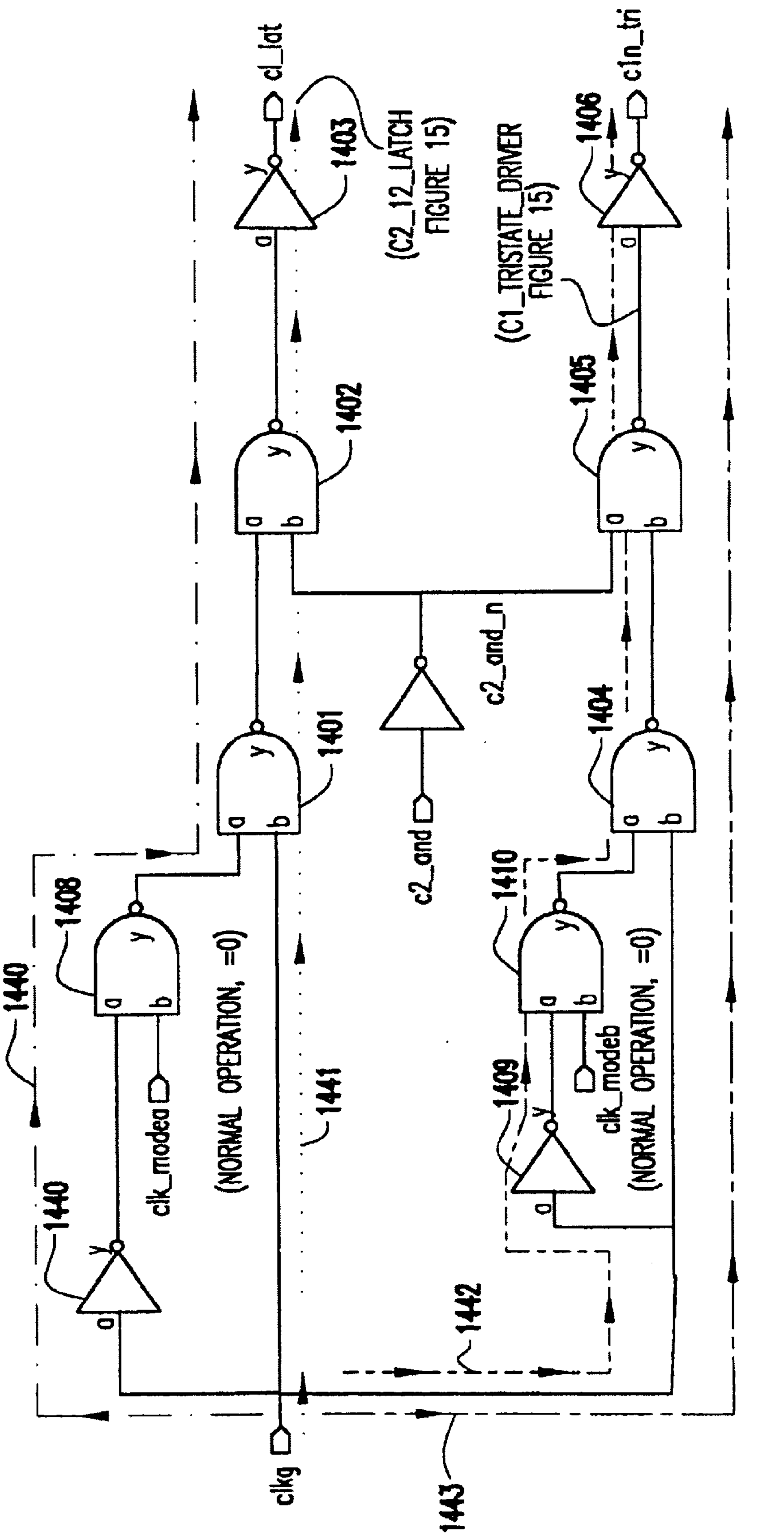
FIG. 14 is a circuit diagram of the local clock driver for the swappers.

FIG. 14 is a schematic diagram of the local clock driver for the swappers. During normal, the global clock propagates through three inverting stages 1401, 1402, and 1403, along path 1441, to produce an inverted pulse on output C2_lat, and likewise, through three inverting stages 1404, 1405, 1406, along path 1443, to produce an inverted pulse on output C1n_tri. FIG. 14 supports all the same timing modes as FIG. 13. The difference between the two circuits is that shown in FIG. 14 operates on a rising "clkg" edge whereas FIG. 13 operates on a falling "clkg" edge. Both driving entities and swappers conduct their timing critical operations of capturing data and immediately redriving it onto the buss wire segments. Path 1440 provides a stress test mode. Path 1442 provides timing relief to potential short path problems. One half swapper drives a new datum onto a buss wire segment before the other half swapper, attached to the same nodes but driving a datum in opposite directions, has completed the capture of the datum on that very same buss segment.

Figure 15:
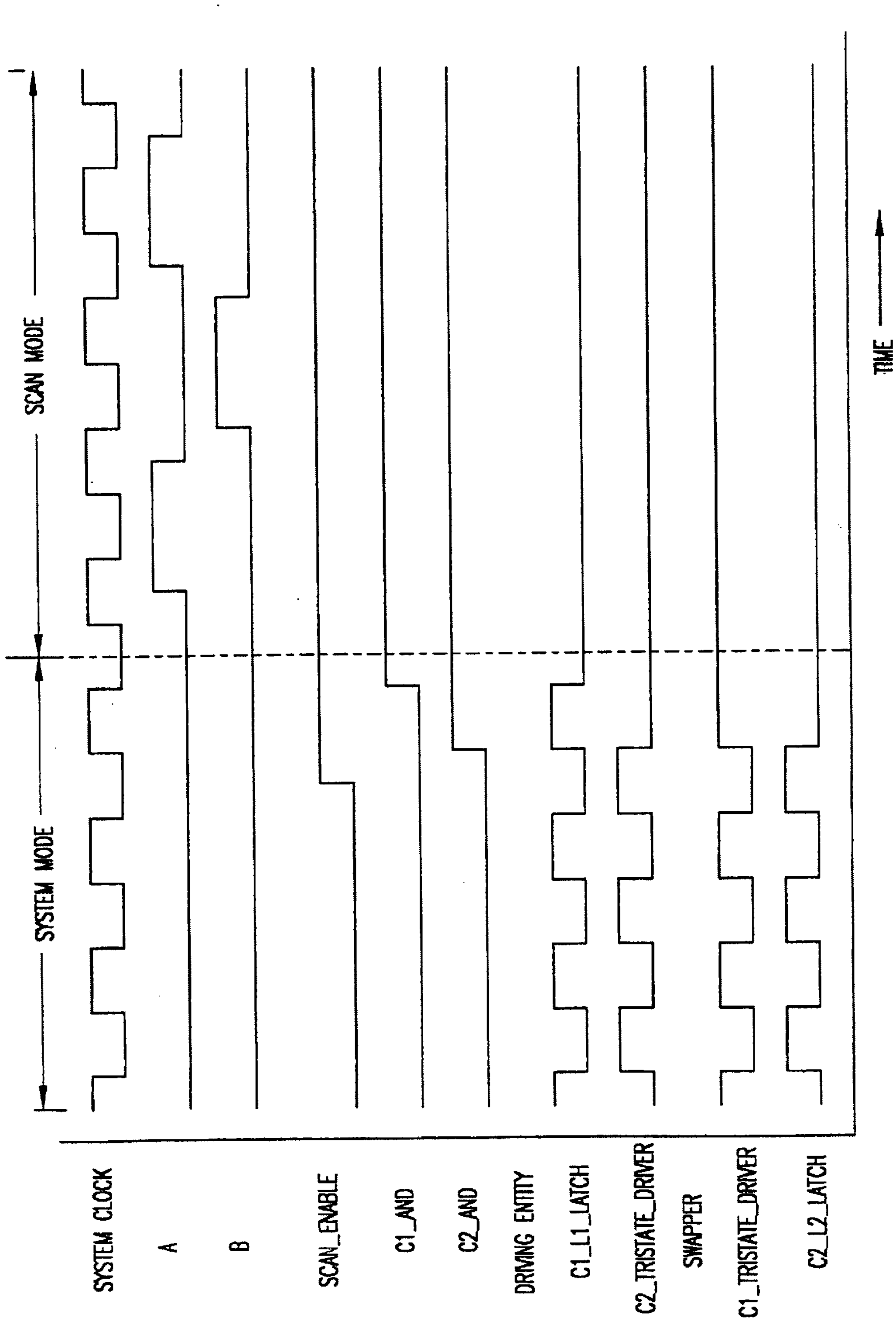
FIG. 15 is a timing diagram of all clock signals, internal clock interactions, and mode control bits such as "scan_ enable" used for robust timing and testing of the synchronous bidirectional data transfer path according to the present invention.

A detail of the hardware infrastructure which implements the test scheme depicted in FIGS. 2A and 2B would comprise the following figures: half swappers of FIG. 6 or FIG. 8, driving entities of FIG. 7, and a local clock driver for driving entities, FIG. 13, and a local clock driver for swappers, FIG. 14, both integrated with a synchronizer and timing control element as depicted in FIG. 11. FIG. 15 shows all clock signals, internal clock interactions, and mode control bits such as "scan_enable" used for robust timing and testing of the synchronous bi-directional data transfer path. Note the C1_tristate_Driver and C2_tristate_Driver signals are always complementary regardless of whether the bidirectional data path is in system or scan mode. This prevents tristate driver contention, that is, one tristate driver forcing the bus wire to VDD while the other drives it to ground.

Those skilled in the art will recognize that the invention can be practiced with modification within the spirit and scope of the appended claims.

We claim:

1. A circuit for synchronously exchanging bidirectional data comprising:

at least two driving entities connected to a bus for sending and receiving data to each other, said at least two driving entities each comprising a master latch having scan-in port for receiving a scan test vector;

a swapper circuit electrically connected to said bus at a connection point between said at least two driving entities, said swapper circuit for capturing data simultaneously traveling in opposite directions on said bus and passing said captured data back onto said bus avoiding collision of the data; and a capture latch at either end of said bus for capturing received data.

2. A circuit for synchronously exchanging bidirectional data as recited in claim 1 further comprising:

a slave latch having an input connected to an output of said master latch, said slave latch having a scan-out port for outputting the scan test vector.

3. A circuit for synchronously exchanging bidirectional data as recited in claim 1 wherein said at least two driving entities comprise:

a tri-state circuit connected to said master latch for driving data output from said master latch onto said bus.

4. A circuit for synchronously exchanging bidirectional data as recited in claim 1 wherein said swapper circuit comprises:

a first latch and tri-state circuit pair connected to said bus for providing a path for data traveling on said bus in one direction; and a second latch and tri-state circuit pair connected to said bus for providing a path for data traveling on said bus in an opposite direction.

5. A circuit for synchronously exchanging bidirectional data as recited in claim 2 wherein said first latch and said second latch of said swapper circuit are connected to receive a system clock and a scan clock.

6. A circuit for synchronously exchanging bidirectional data as recited in claim 2 wherein a plurality of said circuits for synchronously exchanging bidirectional data are connected together with said scan-out port of a first circuit connected to a scan-in port of a second circuit.

7. A circuit for synchronously exchanging bidirectional data, comprising:

at least two driving entities connected to a bus for sending and receiving data to each other, said at least two driving entities each comprising a master latch having scan-in port for receiving a scan test vector and a data output port connected to said bus;

a swapper circuit electrically connected to said bus at a connection point between said at least two driving entities, said swapper circuit for capturing data simultaneously traveling in opposite directions on said bus and passing said captured data back onto said bus avoiding collision of the data; and a capture latch at either end of said bus for capturing received data, wherein a plurality of said circuits for synchronously exchanging bidirectional data are connected together to form at least one scan chain.

8. A circuit for synchronously exchanging bidirectional data as recited in claim 7, further comprising:

a scan only latch having a scan-out port for outputting the scan test vector, wherein an output of said master latch is connected to an input of said scan only latch to form said at least one scan chain.

9. A circuit for synchronously exchanging bidirectional data as recited in claim 7, wherein a data out port of said master latch is connected to said scan-in port of a next master latch wherein said at least one scan chain zig-zags back and forth through alternating ones of said of said master latches and swapper circuits.

10. A circuit for synchronously exchanging bidirectional data as recited in claim 7 wherein said at least two driving entities comprise:

a tri-state circuit connected to said master latch for driving data output from said master latch onto said bus.

11. A circuit for synchronously exchanging bidirectional data as recited in claim 7 wherein said swapper circuit comprises:

a first latch and tri-state circuit pair connected to said bus for providing a path for data traveling on said bus in one direction; and a second latch and tri-state circuit pair connected to said bus for providing a path for data traveling on said bus in an opposite direction.

12. A circuit for synchronously exchanging bidirectional data as recited in claim 11 first latch and tri-state circuit pair and said second latch and tri-state circuit pair are connected to receive system clocks and scan clocks.

13. A method for scan testing a circuit for synchronously exchanging bidirectional data, comprising the steps of:

providing at least two driving entities connected to a bus for sending and receiving data to each other, said at least two driving entities each comprising a master latch having scan-in port;

electrically connecting a swapper circuit to said bus at a connection point between said at least two driving entities, said swapper circuit for capturing data simultaneously traveling in opposite directions on said bus and passing said captured data back onto said bus avoiding collision of the data;

connecting a capture latch at either end of said bus for capturing received data;

connecting a slave latch connected to an output of said master latch, said slave latch having a scan-out port for outputting the scan test vector;

connecting said driving entities, said swapper and said capture latch and said slave latch to a plurality of synchronous clocks;

inputting a scan test vector into said scan-in port;

enabling ones of said synchronous clocks to move said scan test vector through said circuit for one of a plurality of test patterns; and reading data output from said scan-out port.

14. A method for scan testing a circuit for synchronously exchanging bidirectional data as recited in claim 13 wherein said test pattern is a unidirectional test pattern moving said scan test vector from one of an X direction to a Y direction and a Y direction to an X direction.

15. A method for scan testing a circuit for synchronously exchanging bidirectional data as recited in claim 13 wherein said test pattern is a bi-directional test pattern moving a first scan test vector from an X direction to a Y direction and a second test vector from a Y direction to an X direction.

16. A method for scan testing a circuit for synchronously exchanging bidirectional data as recited in claim 13 further comprising the step of:

connecting said scan-out port to a scan in port of a next one of said circuits for synchronously exchanging bidirectional data, such that a plurality of said circuits are connected together in series.

17. A method for scan testing a circuit for synchronously exchanging bidirectional data as recited in claim 16 wherein said test pattern is one of an "S" test pattern and a "Z" test pattern.

* * * * *